United States Patent
Um

(10) Patent No.: US 11,237,768 B2
(45) Date of Patent: Feb. 1, 2022

(54) MEMORY DEVICE CHANGING MEMORY AREA IN WHICH DATA IS STORED AND OPERATING METHOD THEREOF

(71) Applicant: SK hynix Inc., Gyeonggi-do (KR)

(72) Inventor: Gi Pyo Um, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/915,457

(22) Filed: Jun. 29, 2020

(65) Prior Publication Data

US 2021/0181987 A1    Jun. 17, 2021

(30) Foreign Application Priority Data

Dec. 17, 2019   (KR) ................. 10-2019-0169102

(51) Int. Cl.
*G06F 3/06* (2006.01)

(52) U.S. Cl.
CPC ........... *G06F 3/0659* (2013.01); *G06F 3/061* (2013.01); *G06F 3/0638* (2013.01); *G06F 3/0679* (2013.01)

(58) Field of Classification Search
CPC ...... G06F 3/061; G06F 3/0638; G06F 3/0659; G06F 3/0679; G06F 3/0647; G06F 3/0656; G06F 12/02; G06F 13/0673; G11C 11/5628; G11C 16/0483; G11C 16/08; G11C 16/10
See application file for complete search history.

(56) References Cited

U.S. PATENT DOCUMENTS

| 2009/0161435 A1* | 6/2009 | Park ................. | G11C 16/10 365/185.12 |
| 2010/0106893 A1* | 4/2010 | Fasoli ............... | G11C 16/102 711/103 |
| 2018/0121121 A1* | 5/2018 | Mehra ................ | G06F 3/0604 |

FOREIGN PATENT DOCUMENTS

| KR | 10-0878479 | 1/2009 |
| KR | 10-2013-0028349 | 3/2013 |
| KR | 10-2014-0099999 | 8/2014 |
| KR | 10-2016-0094765 | 8/2016 |
| KR | 10-2018-0049148 | 5/2018 |
| KR | 10-2021-0111120 A | 9/2021 |

* cited by examiner

*Primary Examiner* — Larry T Mackall
(74) *Attorney, Agent, or Firm* — IP & T Group LLP

(57) ABSTRACT

Provided herein may be a memory device and a method of operating the same. The memory device may include a page buffer group configured to include a plurality of page buffers respectively coupled to a plurality of memory areas through a plurality of bit lines, a row decoder configured to select a memory area, on which an operation corresponding to a command is to be performed, from among the plurality of memory areas, based on a row address included in an address, a column decoder configured to transfer data to a page buffer of the plurality of page buffers according to a column address included in the address and an address controller configured to control the row decoder and the column decoder so that the data is stored in another memory area other than the selected memory area.

19 Claims, 17 Drawing Sheets

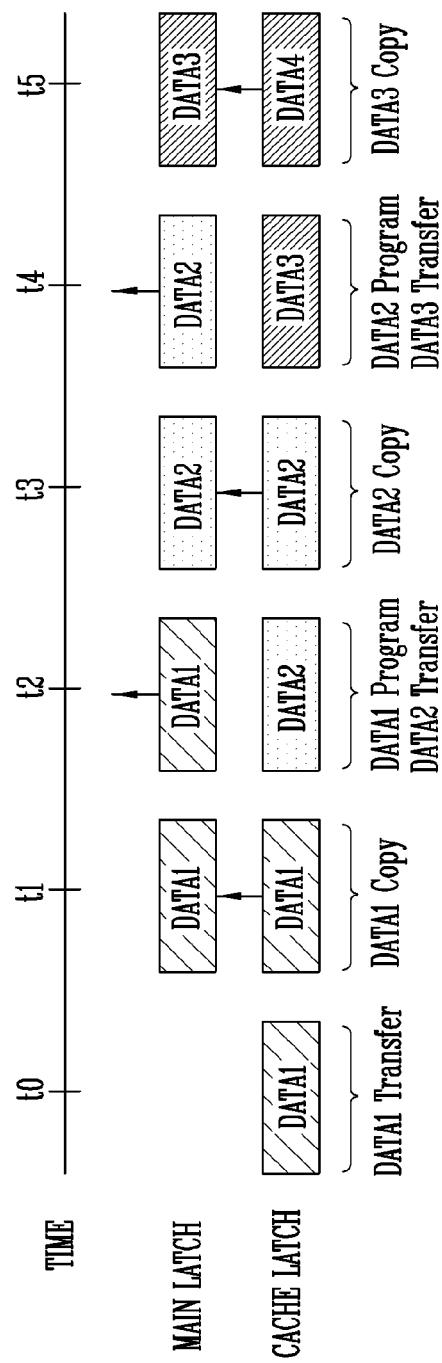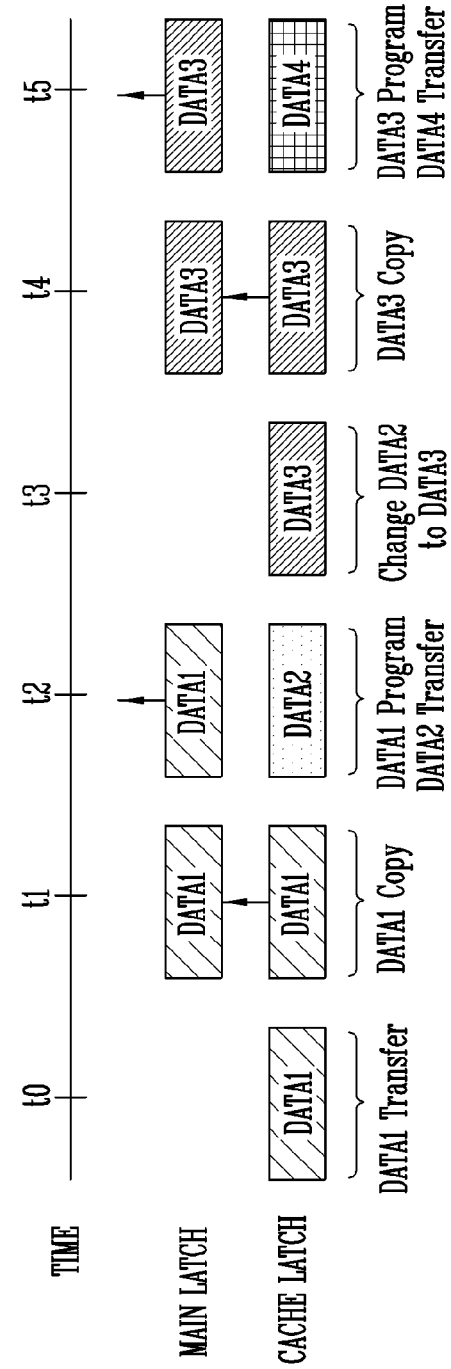

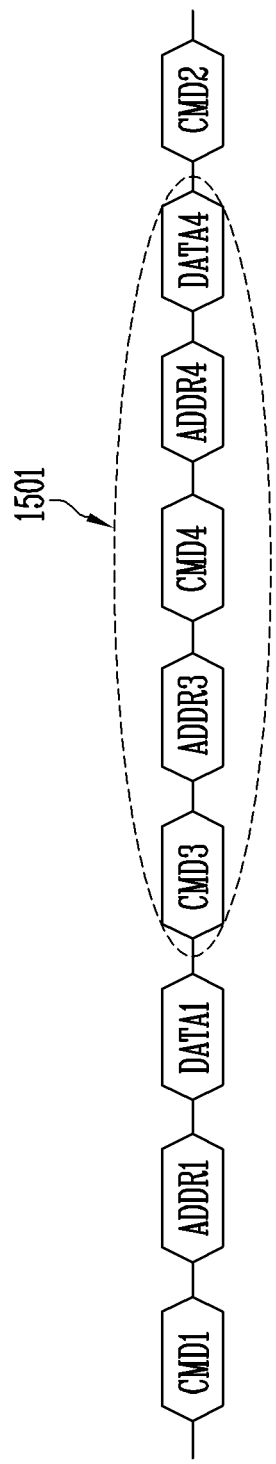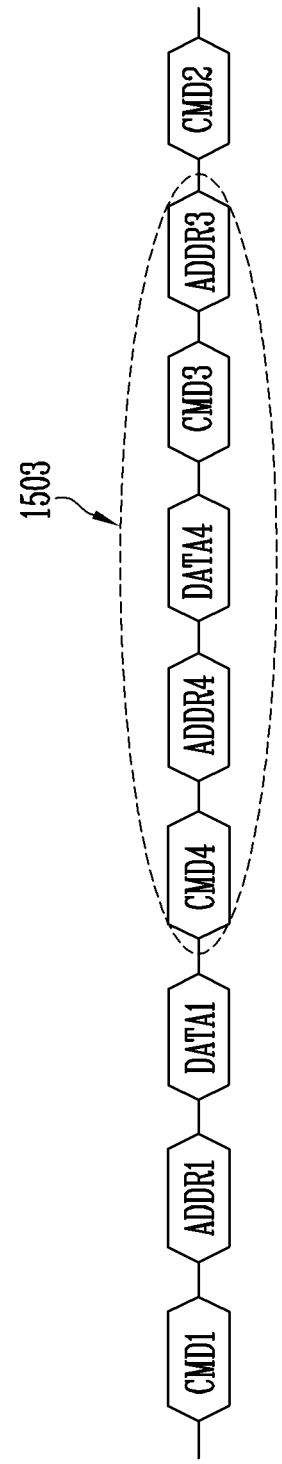

MEMORY DEVICE CHANGING MEMORY AREA IN WHICH DATA IS STORED AND OPERATING METHOD THEREOF

CROSS-REFERENCE TO RELATED APPLICATION

The present application claims priority under 35 U.S.C. § 119(a) to Korean patent application number 10-2019-0169102, filed on Dec. 17, 2019, which is incorporated herein by reference in its entirety.

BACKGROUND

Field of Invention

Various embodiments of the present disclosure generally relate to an electronic device, and more particularly, to a memory device and a method of operating the memory device.

DESCRIPTION OF RELATED ART

A storage device stores data under the control of a host device such as a computer, a smartphone, or a smartpad. Examples of a storage device include a hard disk drive (HDD) which stores data in a magnetic disk, and a solid state drive (SSD) or a memory card which stores data in a semiconductor memory, particularly, a nonvolatile memory.

A storage device may include a memory device in which data is stored and a memory controller which controls storage of the data in the memory device. Such memory devices may a volatile memory or a nonvolatile memory. Representative examples of a nonvolatile memory include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), and a ferroelectric RAM (FRAM).

SUMMARY

Various embodiments of the present disclosure are directed to a memory device that changes a memory area in which data is stored, and a method of operating the memory device.

An embodiment of the present disclosure may provide for a memory device. The memory device may include a memory cell array configured to include a plurality of memory areas, an input/output circuit configured to receive a command, an address, and data from an external controller, a page buffer group configured to include a plurality of page buffers respectively coupled to the plurality of memory areas through a plurality of bit lines, a row decoder configured to select a memory area, on which an operation corresponding to the command is to be performed, from among the plurality of memory areas, based on a row address included in the address, a column decoder configured to transfer the data to a page buffer of the plurality of page buffers according to a column address included in the address and an address controller configured to control the row decoder and the column decoder so that the data is stored in another memory area other than the selected memory area, in response to an address change command received from the external controller.

An embodiment of the present disclosure may provide for a memory device. The memory device may include a memory cell array configured to include a plurality of memory areas, an input/output circuit configured to receive a command, an address, and data from an external controller, a page buffer group configured to include a plurality of page buffers respectively coupled to the plurality of memory areas through a plurality of bit lines, a row decoder configured to select a memory area, on which an operation corresponding to the command is to be performed, from among the plurality of memory areas according to a row address included in the address, a column decoder configured to transfer the data to a page buffer of the plurality of page buffers according to a column address included in the address and an address controller configured to control the column decoder so that change data for changing the data is stored in the page buffer of the plurality of page buffers in response to a data change command that is received from the external controller.

An embodiment of the present disclosure may provide for a method of operating a memory device, the memory device including a plurality of memory areas and a plurality of page buffers respectively coupled to the plurality of memory areas through a plurality of bit lines. The method may include receiving a command, an address, and data from an external controller, selecting a memory area, on which an operation corresponding to the command is to be performed, from among the plurality of memory areas according to a row address included in the address, transferring the data to a page buffer of the plurality of page buffers according to a column address included in the address, receiving an address change command for instructing a change of the address and storing the data in another memory area other than the selected memory area in response to the address change command.

An embodiment of the present disclosure may provide for an operating method of a memory system, the memory system including a controller and a memory device. The operating method may include sequentially providing, by a controller to the memory device, one or more of first and second command groups, updating, by the memory device in response to the first command group, data currently buffered in a page buffer indicated by a column address to updated data, the column address and the updated data being included in the first command group and programming, by the memory device in response to the confirm command, data currently buffered in page buffers into a memory region indicated by a last provided row address, wherein the second command group includes a row address different from a row address included in an immediately previous command group, wherein the first command group selectively includes a row address different from a row address included in an immediately previous command group.

An embodiment of the present disclosure may provide for an operating method of a controller. The operating method may include, by sequentially providing one or more of first and second command groups, controlling a memory device to update, in response to the first command group, data currently buffered in a page buffer indicated by a column address to updated data, the column address and the updated data being included in the first command group and program, in response to the confirm command, data currently buffered in page buffers into a memory region indicated by a last provided row address, wherein the second command group includes a row address different from a row address included in an immediately previous command group, wherein the first command group selectively includes a row address different from a row address included in an immediately previous command group.

An embodiment of the present disclosure may provide for an operating method of a memory device operative in response to sequential one or more of first and second command groups. The operating method may include updating, in response to the first command group, data currently buffered in a page buffer indicated by a column address to updated data, the column address and the updated data being included in the first command group and programming, in response to the confirm command, data currently buffered in page buffers into a memory region indicated by a last provided row address, wherein the second command group includes a row address different from a row address included in an immediately previous command group, wherein the first command group selectively includes a row address different from a row address included in an immediately previous command group.

BRIEF DESCRIPTION OF THE DRAWINGS

FIG. 12 is a diagram illustrating a cache program operation.

FIG. 13 is a diagram illustrating a cache program operation to which the present invention is applied.

FIGS. 15A and 15B are diagrams for explaining a case where an address change command and a data change command are received together.

DETAILED DESCRIPTION

Specific structural and functional description provided herein is directed to embodiments of the present invention. However, various aspects and features of the present invention may be practiced in various forms. Thus, the present invention is not limited to the embodiments disclosed herein.

Various embodiments of the present disclosure are described more fully below with reference to the accompanying drawings, so that those skilled in the art can easily practice the present invention.

Figure 1:
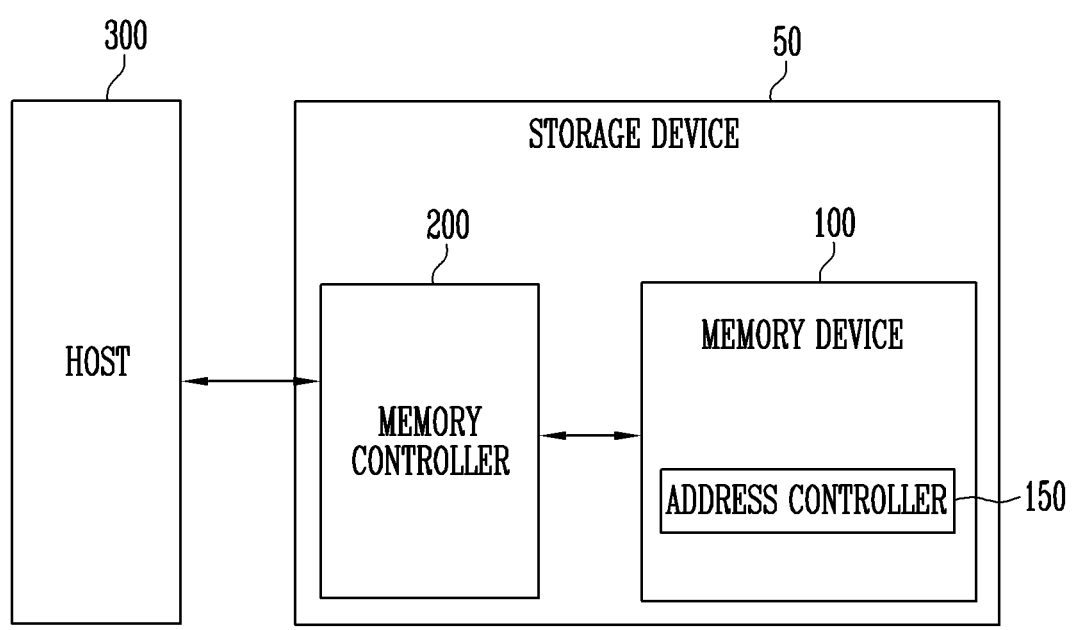
FIG. 1 is a block diagram illustrating a storage device.

FIG. 1 is a block diagram illustrating a storage device.

Referring to FIG. 1, a storage device 50 may include a memory device 100, a memory controller 200, and a buffer memory (not illustrated).

The storage device 50 may store data under the control of a host 300, such as a mobile phone, a smartphone, an MP3 player, a laptop computer, a desktop computer, a game console, a television (TV), a tablet PC, or an in-vehicle infotainment system.

The storage device 50 may be configured as any of various types of storage devices depending on a host interface that is a scheme for communication with the host 300. For example, the storage device 50 may be implemented as a solid state disk (SSD), a multimedia card such as an MMC, an embedded MMC (eMMC), a reduced size MMC (RS-MMC), or a micro-MMC, a secure digital card such as an SD, a mini-SD, or a micro-SD, a universal storage bus (USB) storage device, a universal flash storage (UFS) device, a personal computer memory card international association (PCMCIA) card-type storage device, a peripheral component interconnection (PCI)-card type storage device, a PCI express (PCI-E) card-type storage device, a compact flash (CF) card, a smart media card, and/or a memory stick.

The storage device 50 may be manufactured in any of various types of package forms. For example, the storage device 50 may be manufactured as package on package (POP), system in package (SIP), system on chip (SOC), multi-chip package (MCP), chip on board (COB), wafer-level fabricated package (WFP), and/or wafer-level stack package (WSP).

The memory device 100 may store data. The memory device 100 is operated in response to the control of the memory controller 200. The memory device 100 may include a memory cell array including a plurality of memory cells which store data. The memory cell array may include a plurality of memory blocks. Each memory block may include a plurality of memory cells, which may constitute a plurality of pages. In an embodiment, each page may be a unit by which data is stored in the memory device 100 or by which data stored in the memory device 100 is read. A memory block may be a unit by which data is erased.

In an embodiment, the memory device 100 may take many alternative forms, such as a double data rate synchronous dynamic random access memory (DDR SDRAM), a low power double data rate fourth generation (LPDDR4) SDRAM, a graphics double data rate (GDDR) SDRAM, a low power DDR (LPDDR) SDRAM, a Rambus dynamic random access memory (RDRAM), a NAND flash memory, a vertical NAND flash memory, a NOR flash memory device, a resistive RAM (RRAM), a phase-change memory (PRAM), a magnetoresistive RAM (MRAM), a ferroelectric RAM (FRAM), or a spin transfer torque RAM (STT-RAM). In the present specification, features and aspects of the present invention are described in the context in which the memory device 100 is a NAND flash memory.

The memory device 100 may be implemented in a two-dimensional (2D) array structure or a three-dimensional (3D) array structure. The present disclosure may also be applied not only to a flash memory device in which a charge storage layer is formed of a conductive floating gate (FG), but also to a charge trap flash (CTF) memory device in which a charge storage layer is formed of an insulating layer.

In an embodiment, the memory device 100 may be operated in a single-level cell (SLC) manner in which one data bit is stored in one memory cell. Alternatively, the memory device 100 may be operated in a manner in which at least two data bits are stored in one memory cell. For example, the memory device 100 may be operated in a multi-level cell (MLC) manner in which two data bits are stored in one memory cell, a triple-level cell (TLC) manner in which three data bits are stored in one memory cell, or a quadruple-level cell (QLC) manner in which four data bits are stored in one memory cell.

The memory device 100 may receive a command and an address from the memory controller 200, and may access the area of the memory cell array, selected by the address. That is, the memory device 100 may perform an operation corresponding to the command on the area selected by the address. For example, the memory device 100 may perform a write operation (i.e., program operation), a read operation or an erase operation in response to the received command. When a program command is received, the memory device 100 may program data to the area selected by the address. When a read command is received, the memory device 100 may read data from the area selected by the address. When an erase command is received, the memory device 100 may erase data stored in the area selected by the address.

The memory device 100 may include an address controller 150. The address controller 150 may control the received address based on an address change command and/or a data change command received from the memory controller 200. The address change command may instruct a change of a scheme of programming data received from the memory controller 200. In particular, the address change command may instruct a change of a data program scheme in response to a command that is received before a confirm command is received.

In detail, the memory device 100 may receive an address from the memory controller 200, wherein the address received from the memory controller 200 may include a row address and a column address. The address controller 150 may control a peripheral circuit (see FIG. 2) so that at least one of the received row address and column address is used.

For example, the address controller 150 may output the column address to a column decoder and the row address to a row decoder. Thereafter, the column decoder may select a page buffer corresponding to the column address, and the row decoder may select a memory area corresponding to the row address. The memory area may be any area within a memory cell array. That is, the memory area may be at least one memory block.

In the present disclosure, the address controller 150 may control the peripheral circuit so that the received data is stored in the page buffer using the column address and a memory area in which the data is to be stored is selected using the row address.

The memory controller 200 may control the overall operation of the storage device 50.

When power is applied to the storage device 50, the memory controller 200 may run firmware (FW). When the memory device 100 is a flash memory device 100, the memory controller 200 may run firmware such as a Flash Translation Layer (FTL) for controlling communication between the host 300 and the memory device 100.

In an embodiment, the memory controller 200 may receive data and a logical block address (LBA) from the host 300, and may translate the logical block address (LBA) into a physical block address (PBA) indicating the address of memory cells which are included in the memory device 100 and in which data is to be stored. Further, the memory controller 200 may store a logical-physical address mapping table, which configures mapping relationships between logical block addresses (LBA) and physical block addresses (PBA), in the buffer memory.

The memory controller 200 may control the memory device 100 so that a program operation, a read operation or an erase operation is performed in response to a request received from the host 300. For example, when a program request is received from the host 300, the memory controller 200 may convert the program request into a program command, and may provide the program command, a physical block address (PBA), and data to the memory device 100. When a read request together with a logical block address is received from the host 300, the memory controller 200 may convert the read request into a read command, select a physical block address corresponding to the logical block address, and thereafter provide the read command and the physical block address (PBA) to the memory device 100. When an erase request together with a logical block address is received from the host 300, the memory controller 200 may convert the erase request into an erase command, select a physical block address corresponding to the logical block address, and thereafter provide the erase command and the physical block address (PBA) to the memory device 100.

In an embodiment, the memory controller 200 may autonomously generate a program command, an address, and data without receiving a request from the host 300, and may transmit them to the memory device 100. For example, the memory controller 200 may provide commands, addresses, and data to the memory device 100 to perform background operations, such as a program operation for wear leveling and a program operation for garbage collection.

In an embodiment, the memory controller 200 may control data exchange between the host 300 and the buffer memory (not illustrated). Alternatively, the memory controller 200 may temporarily store system data for controlling the memory device 100 in the buffer memory. For example, the memory controller 200 may temporarily store data, input from the host 300, in the buffer memory, and may then transmit the data, temporarily stored in the buffer memory, to the memory device 100.

In various embodiments, the buffer memory may be used as a working memory or a cache memory for the memory controller 200. The buffer memory may store codes or commands that are executed by the memory controller 200. Alternatively, the buffer memory may store data that is processed by the memory controller 200.

In an embodiment, the buffer memory may be implemented as a DRAM such as a double data rate SDRAM (DDR SDRAM), a double data rate fourth generation (DDR4) SDRAM, a low power double data rate fourth generation (LPDDR4) SDRAM, a graphics double data rate (GDDR) SDRAM, a low power DDR (LPDDR) SDRAM, or a Rambus DRAM (RDRAM), or as a static RAM (SRAM).

In various embodiments, the storage device 50 may not include the buffer memory. In this case, a volatile memory device disposed outside the storage device 50 may function as the buffer memory.

In an embodiment, the memory controller 200 may control at least two memory devices 100. In this case, the memory controller 200 may control the memory devices 100 by way of an interleaving scheme to improve operating performance.

The host 300 may communicate with the storage device 50 using at least one of various communication methods, such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and/or Load Reduced DIMM (LRDIMM) communication methods.

Figure 2:
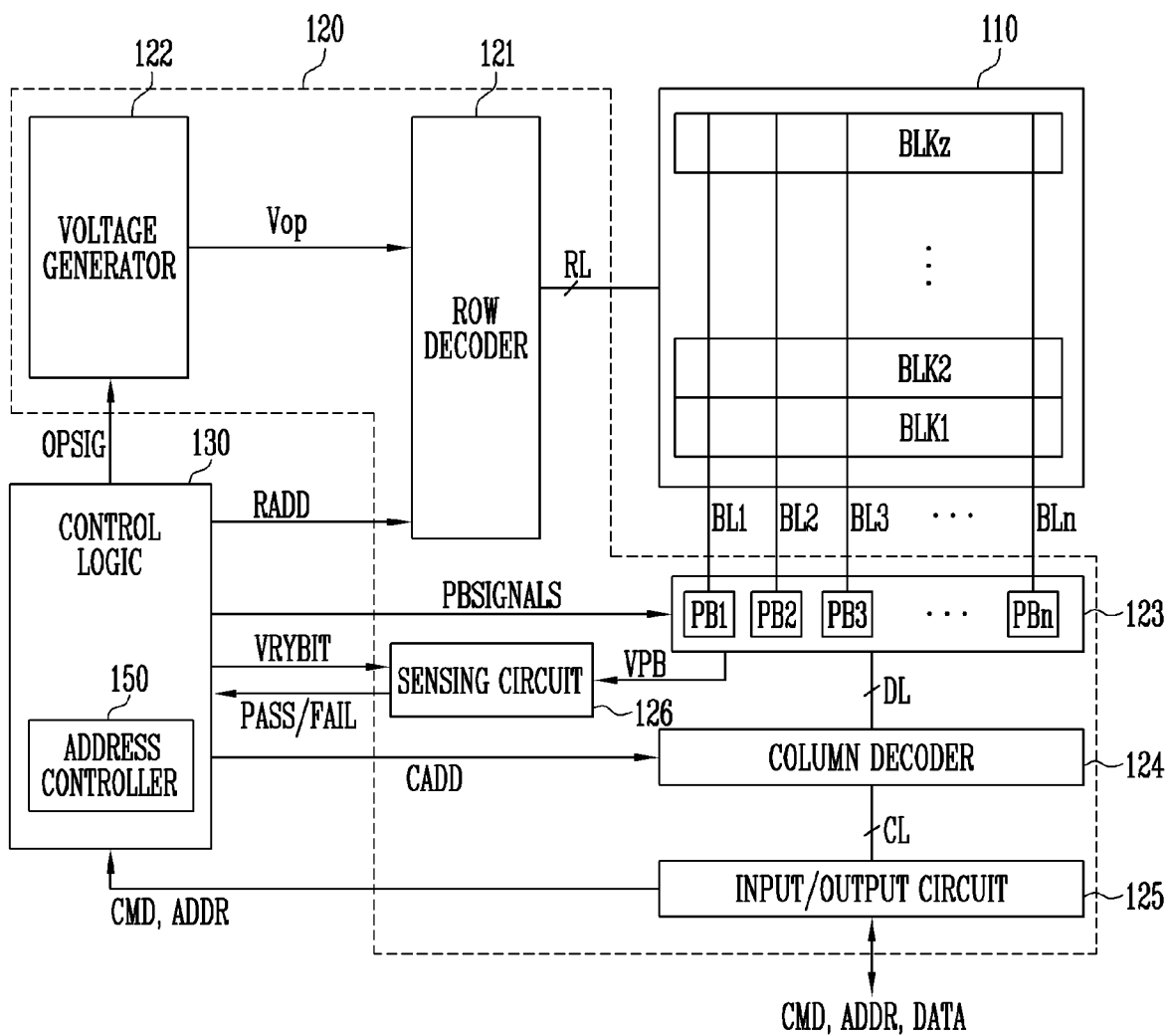
FIG. 2 is a diagram illustrating the structure of a memory device, such as that of FIG. 1.

FIG. 2 is a diagram illustrating a structure of the memory device of FIG. 1.

Referring to FIG. 2, the memory device 100 may include a memory cell array 110, a peripheral circuit 120, and control logic 130.

The memory cell array 110 includes a plurality of memory blocks BLK1 to BLKz. The plurality of memory blocks BLK1 to BLKz are coupled to a row decoder 121 through row lines RL. Each of the memory blocks BLK1 to BLKz may be coupled to a page buffer group 123 through bit lines BL1 to BLn. Each of the memory blocks BLK1 to BLKz may include a plurality of memory cells. In an embodiment, the plurality of memory cells may be nonvolatile memory cells. Memory cells coupled to the same word line may be defined as a single page. Therefore, a single memory block may include a plurality of pages.

The row lines RL may include at least one source select line, a plurality of word lines, and at least one drain select line.

Each of the memory cells included in the memory cell array 110 may be implemented as a single-level cell (SLC) capable of storing one data bit, a multi-level cell (MLC) capable of storing two data bits, a triple-level cell (TLC) capable of storing three data bits, or a quadruple-level cell (QLC) capable of storing four data bits.

The peripheral circuit 120 may perform a program operation, a read operation, or an erase operation on a selected area of the memory cell array 110 under the control of the control logic 130. The peripheral circuit 120 may drive the memory cell array 110. For example, the peripheral circuit 120 may apply various operating voltages to the row lines RL and the bit lines BL1 to BLn or discharge the applied voltages under the control of the control logic 130.

The peripheral circuit 120 may include the row decoder 121, a voltage generator 122, the page buffer group 123, a column decoder 124, an input/output circuit 125, and a sensing circuit 126.

The row decoder 121 is coupled to the memory cell array 110 through the row lines RL. The row lines RL may include the at least one source select line, the plurality of word lines, and the at least one drain select line. In an embodiment, the word lines may include normal word lines and dummy word lines. In an embodiment, the row lines RL may further include a pipe select line.

The row decoder 121 may decode a row address RADD received from the control logic 130. The row decoder 121 selects at least one of the memory blocks BLK1 to BLKz according to the decoded address. Further, the row decoder 121 may select at least one word line WL of the selected memory block so that voltages generated by the voltage generator 122 are applied to the at least one word line WL according to the decoded address.

For example, during a program operation, the row decoder 121 may apply a program voltage to a selected word line and apply a program pass voltage having a level lower than that of the program voltage to unselected word lines. During a program verify operation, the row decoder 121 may apply a verify voltage to a selected word line and apply a verify pass voltage higher than the verify voltage to unselected word lines. During a read operation, the row decoder 121 may apply a read voltage to a selected word line and apply a read pass voltage higher than the read voltage to unselected word lines.

In an embodiment, the erase operation of the memory device 100 is performed on a memory block basis. During an erase operation, the row decoder 121 may select one memory block according to the decoded address. During the erase operation, the row decoder 121 may apply a ground voltage to word lines coupled to the selected memory block.

The voltage generator 122 may be operated under the control of the control logic 130. The voltage generator 122 may generate a plurality of voltages using an external supply voltage provided to the memory device 100. In detail, the voltage generator 122 may generate various operating voltages Vop that are used for program, read, and erase operations in response to an operation signal OPSIG. For example, the voltage generator 122 may generate a program voltage, a verify voltage, a pass voltages, a read voltage, an erase voltage, etc. under the control of the control logic 130.

In an embodiment, the voltage generator 122 may generate an internal supply voltage by regulating the external supply voltage. The internal supply voltage generated by the voltage generator 122 is used as an operating voltage for the memory device 100.

In an embodiment, the voltage generator 122 may generate a plurality of voltages using the external supply voltage or the internal supply voltage.

For example, the voltage generator 122 may include a plurality of pumping capacitors for receiving the internal supply voltage and generate a plurality of voltages by selectively enabling the plurality of pumping capacitors under the control of the control logic 130.

The generated voltages may be supplied to the memory cell array 110 by the row decoder 121.

The page buffer group 123 includes first to n-th page buffers PB1 to PBn, which are coupled to the memory cell array 110 through the first to n-th bit lines BL1 to BLn, respectively. The first to n-th page buffers PB1 to PBn are operated under the control of the control logic 130. In detail, the first to n-th page buffers PB1 to PBn may be operated in response to page buffer control signals PBSIGNALS. For example, the first to n-th page buffers PB1 to PBn may temporarily store data received through the first to n-th bit lines BL1 to BLn or may sense voltages or currents of the bit lines BL1 to BLn during a read or verify operation.

In detail, during a program operation, when the program voltage is applied to the selected word line, the first to n-th page buffers PB1 to PBn may transfer the data DATA, received through the input/output circuit 125, to selected memory cells through the first to n-th bit lines BL1 to BLn. The memory cells in the selected page are programmed based on the received data DATA. During a program verify operation, the first to n-th page buffers PB1 to PBn may read page data by sensing the voltages or currents received through the first to n-th bit lines BL1 to BLn from the selected memory cells.

During a read operation, the first to n-th page buffers PB1 to PBn may read data DATA from the memory cells in the selected page through the first to n-th bit lines BL1 to BLn, and may output the read data DATA to the input/output circuit 125 under the control of the column decoder 124.

During the erase operation, the first to n-th page buffers PB1 to PBn may allow the first to n-th bit lines BL1 to BLn to float or may apply the erase voltage to the first to n-th bit lines BL1 to BLn.

The column decoder 124 may transfer data between the input/output circuit 125 and the page buffer group 123 in response to a column address CADD. For example, the column decoder 124 may exchange data with the first to n-th page buffers PB1 to PBn through data lines DL or may exchange data with the input/output circuit 125 through column lines CL.

The input/output circuit 125 may transfer a command CMD and an address ADDR, received from the memory controller 200 described above with reference to FIG. 1, to the control logic 130, or may exchange data DATA with the column decoder 124.

During a read operation or a verify operation, the sensing circuit 126 may generate a reference current in response to an enable bit VRYBIT, and may compare a sensing voltage VPB received from the page buffer group 123 with a reference voltage generated by the reference current and then output a pass signal PASS or a fail signal FAIL.

The control logic 130 may control the peripheral circuit 120 by outputting the operation signal OPSIG, the row address RADD, the page buffer control signals PBSIG-NALS, and the enable bit VRYBIT in response to the command CMD and the address ADDR. In addition, the control logic 130 may determine whether a verify operation has passed or failed in response to the pass or fail signal PASS or FAIL.

The memory cells included in the memory cell array 110 may be programmed to any one of a plurality of program states in each memory cell. The number of program states for a given memory cell depends on its type, i.e., SLC, MLC, TLC, QLC, etc. A target program state of the corresponding memory cell may be determined to be any one of the plurality of program states depending on the data to be stored.

In an embodiment of the present disclosure, the control logic 130 may include an address controller 150. The address controller 150 may control a column address and a row address included in the address ADDR received from the memory controller 200 (shown in FIG. 1). For example, the address controller 150 may control the column and row addresses so that the column address is transmitted to the column decoder 124 and the row address is transmitted to the row decoder 121.

In an embodiment, after receiving a setup command from the memory controller 200, the memory device 100 may sequentially receive the address ADDR and the data DATA.

However, before receiving a confirm command from the memory controller 200, the memory device 100 may receive a new command. The new command may be an address change command or a data change command.

In an embodiment, the address change command may be for instructing the storage of data in a new memory area, regardless of the row address included in the address ADDR received from the memory controller 200 before receiving the address change command. The memory area may be any one of areas included in the memory cell array 110. That is, the memory area may be an area corresponding to at least one memory block.

Also, the data change command may be for changing the data DATA received from the memory controller 200 to other data. A change address received, together with the data change command, from the memory controller 200 may include a change row address as well as a change column address. The memory device 100 may store the change data in a new memory area based on the change row address.

Consequently, before receiving a confirm command, the memory device 100 may receive a new command, and may store data in another memory area (i.e., a memory area other than a previously determined memory area) in response to the new command. Therefore, the data is stored in the memory area other than the previously determined memory area, and thus a data storage scheme may change.

For example, even if the data storage scheme has been determined to be a single-level cell (SLC) scheme based on the row address included in the address ADDR received from the memory controller 200, data may be stored using a scheme, such as a multi-level cell (MLC), triple-level cell (TLC) or quadruple-level cell (QLC) scheme, based on a subsequently received change address. Further, even if the data storage scheme has been determined to be a triple-level cell (TLC) scheme, data may be stored using a scheme, such as a single-level cell (SLC), multi-level cell (MLC), or quadruple-level cell (QLC) scheme, based on a subsequently received change address.

As described above, the memory device 100 may storage data using various schemes, such as the SLC and the MLC schemes. When a program scheme changes, a new row address is required, and thus the memory device 100 may ignore the received row address and receive a new address (i.e., a change address) from the memory controller 200. The new address or the change address may be received together with an address change command or a data change command.

The address controller 150 may output the column address to the column decoder 124. The column decoder 124 may decode the column address CADD, and may then determine a page buffer in which the data received from the memory controller 200 is to be stored. When the page buffer is determined by the column decoder 124, the data received from the memory controller 200 may be stored in the corresponding page buffer.

Also, the address controller 150 may output the row address to the row decoder 121. The row decoder 121 may decode the row address, and may then determine a memory area in which the data received from the memory controller 200 is to be stored. When the memory area is determined by the row decoder 121, the data received from the memory controller 200 may be stored in the corresponding memory area.

Figure 3:
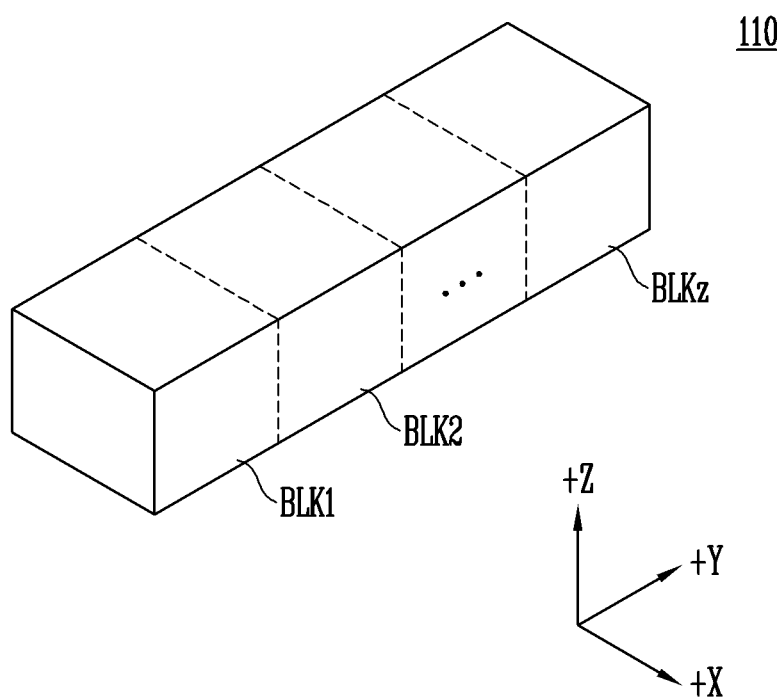
FIG. 3 is a diagram illustrating an embodiment of a memory cell array, such as that of FIG. 2.

FIG. 3 is a diagram illustrating an embodiment of the memory cell array of FIG. 2.

Referring to FIG. 3, the memory cell array 110 includes a plurality of memory blocks BLK1 to BLKz. Each memory block may have a three-dimensional (3D) structure. Each memory block includes a plurality of memory cells stacked on a substrate. Such memory cells are arranged in a positive X (+X) direction, a positive Y (+Y) direction, and a positive Z (+Z) direction. The structure of each memory block is described in detail below with reference to FIGS. 4 and 5.

Figure 4:
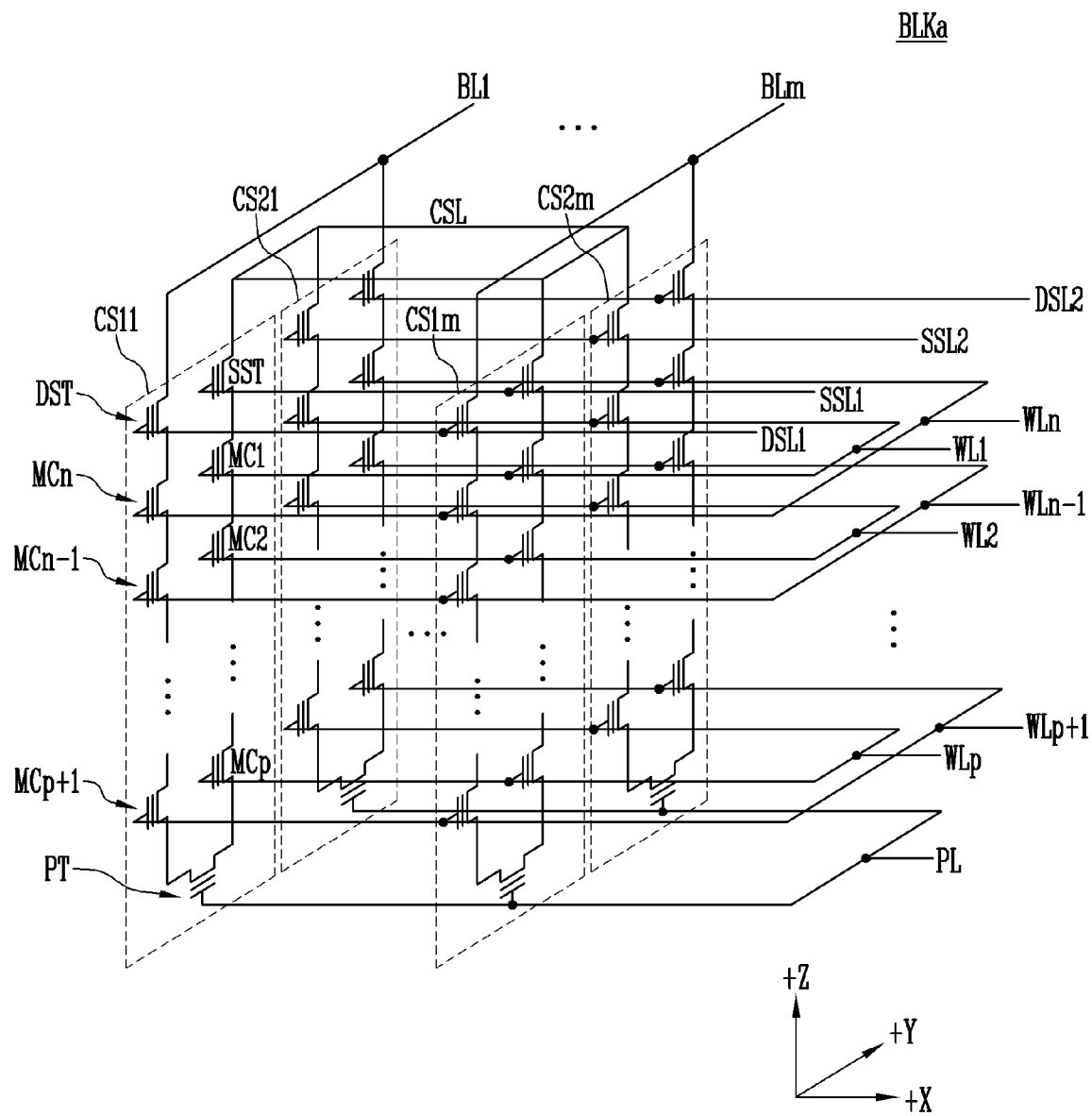
FIG. 4 is a circuit diagram illustrating a representative memory block BLKa of memory blocks BLK1 to BLKz of FIG. 3.

FIG. 4 is a circuit diagram illustrating a representative memory block BLKa of the memory blocks BLK1 to BLKz of FIG. 3.

Referring to FIG. 4, the memory block BLKa includes a plurality of cell strings CS11 to CS1m and CS21 to CS2m. In an embodiment, each of the cell strings CS11 to CS1m and CS21 to CS2m may be formed in a 'U' shape. In the memory block BLKa, m cell strings are arranged in a row direction (i.e. a positive (+) X direction). In FIG. 4, two cell strings are illustrated as being arranged in a column direction (i.e. a positive (+) Y direction). However, this illustration is made for clarity; it will be understood that three or more cell strings may be arranged in the column direction.

Each of the plurality of cell strings CS11 to CS1m and CS21 to CS2m includes at least one source select transistor SST, first to n-th memory cells MC1 to MCn, a pipe transistor PT, and at least one drain select transistor DST.

The source select transistor SST of each cell string is connected between the common source line CSL and memory cells MC1 to MCp.

In an embodiment, the source select transistors of cell strings arranged in the same row are coupled to a source select line extending in a row direction, and source select transistors of cell strings arranged in different rows are coupled to different source select lines. In FIG. 4, source select transistors of cell strings CS11 to CS1m in a first row are coupled to a first source select line SSL1. The source select transistors of cell strings CS21 to CS2m in a second row are coupled to a second source select line SSL2.

In an embodiment, source select transistors of the cell strings CS11 to CS1m and CS21 to CS2m may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are sequentially arranged in a direction opposite a positive (+) Z direction and are connected in series between the source select transistor SST and the pipe transistor PT. The p+1-th to n-th memory cells MCp+1 to MCn are sequentially arranged in the +Z direction and are connected in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

A gate of the pipe transistor PT of each cell string is coupled to a pipeline PL.

The drain select transistor DST of each cell string is connected between the corresponding bit line and the memory cells MCp+1 to MCn. The cell strings in a row direction are coupled to drain select lines extending in a row direction. Drain select transistors of cell strings CS11 to CS1m in the first row are coupled to a first drain select line DSL1. Drain select transistors of cell strings CS21 to CS2m in a second row are coupled to a second drain select line DSL2.

Cell strings arranged in a column direction are coupled to bit lines extending in a column direction. In FIG. 4, cell strings CS11 and CS21 in a first column are coupled to a first bit line BL1. Cell strings CS1m and CS2m in an m-th column are coupled to an m-th bit line BLm.

The memory cells coupled to the same word line in cell strings arranged in a row direction constitute a single page. For example, memory cells coupled to the first word line WL1, among the cell strings CS11 to CS1m in the first row, constitute a single page. Memory cells coupled to the first word line WL1, among the cell strings CS21 to CS2m in the second row, constitute a single additional page. Cell strings arranged in the direction of a single row may be selected by selecting any one of the drain select lines DSL1 and DSL2. A single page may be selected from the selected cell strings by selecting any one of the word lines WL1 to WLn.

In an embodiment, even bit lines and odd bit lines, instead of first to m-th bit lines BL1 to BLm, may be provided. Further, even-numbered cell strings, among the cell strings CS11 to CS1m or CS21 to CS2m arranged in a row direction, may be coupled to the even bit lines, respectively, and odd-numbered cell strings, among the cell strings CS11 to CS1m or CS21 to CS2m arranged in the row direction, may be coupled to the odd bit lines, respectively.

In an embodiment, one or more of the first to n-th memory cells MC1 to MCn may be used as dummy memory cells. For example, dummy memory cell(s) are provided to reduce an electric field between the source select transistor SST and the memory cells MC1 to MCp. Alternatively, dummy memory cell(s) are provided to reduce an electric field between the drain select transistor DST and the memory cells MCp+1 to MCn. As more dummy memory cells are provided, the reliability of the operation of the memory block BLKa is improved, but the size of the memory block BLKa is increased. As fewer memory cells are provided, the size of the memory block BLKa is reduced, but the reliability of the operation of the memory block BLKa may be deteriorated.

In order to efficiently control the dummy memory cell(s), each of the dummy memory cells may have a required threshold voltage. Before or after the erase operation of the memory block BLKa is performed, a program operation may be performed on all or some of the dummy memory cells. When an erase operation is performed after the program operation has been performed, the threshold voltages of the dummy memory cells control the voltages that are applied to the dummy word lines coupled to respective dummy memory cells, and thus the dummy memory cells may have required threshold voltages.

Figure 5:
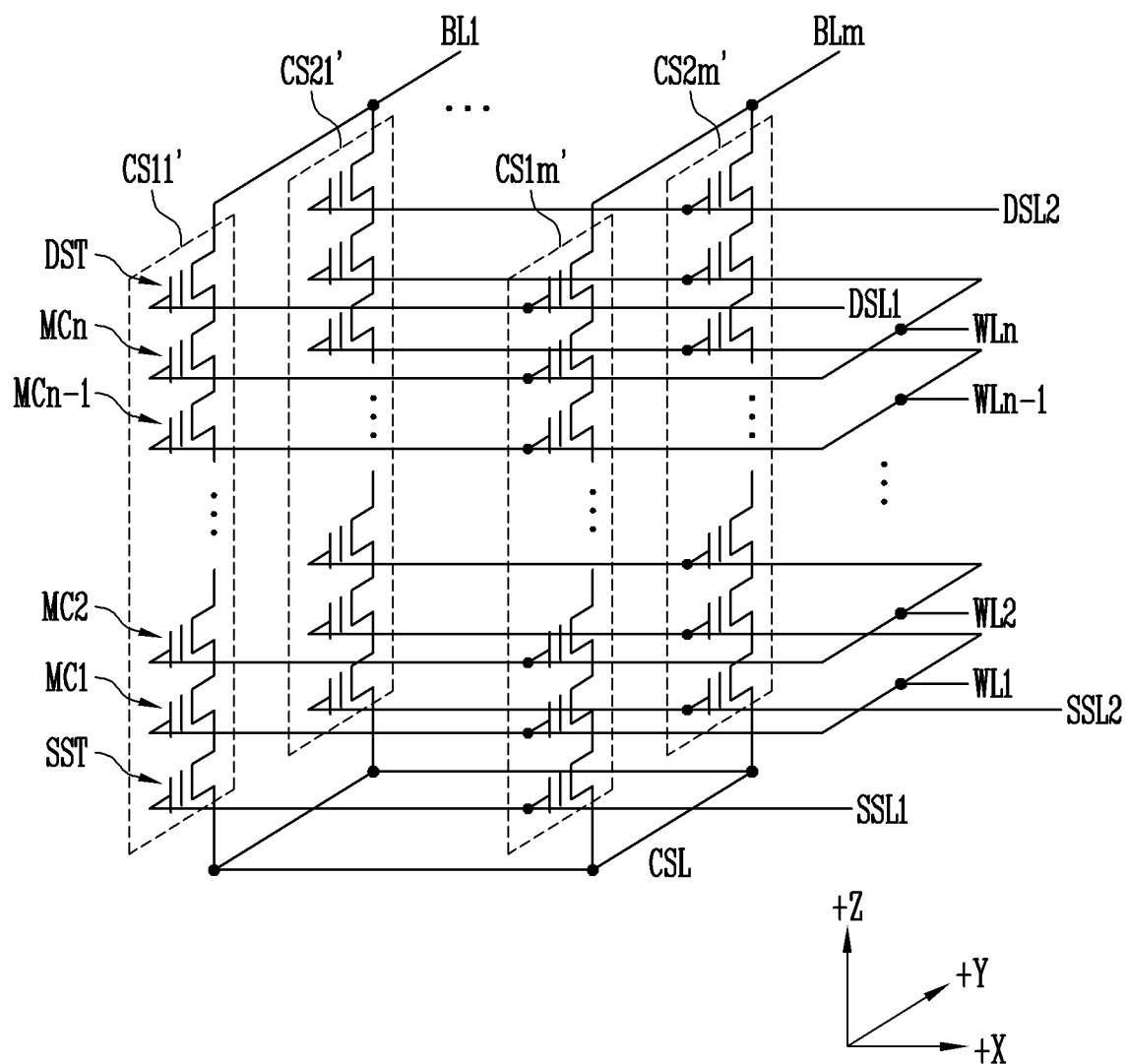
FIG. 5 is a circuit diagram illustrating a representative memory block BLKb of the memory blocks BLK1 to BLKz of FIG. 3.

FIG. 5 is a circuit diagram illustrating a representative memory block BLKb of the memory blocks BLK1 to BLKz of FIG. 3.

Referring to FIG. 5, the memory block BLKb includes a plurality of cell strings CS11' to CS1m' and CS21' to CS2m'. Each of the plurality of cell strings CS11' to CS1m' and CS21' to CS2m' extends in a positive Z (+Z) direction. Each of the cell strings CS11' to CS1m' and CS21' to CS2m' includes at least one source select transistor SST, first to n-th memory cells MC1 to MCn, and at least one drain select transistor DST, which are stacked on a substrate (not illustrated) below the memory block BLKb.

The source select transistor SST of each cell string is connected between a common source line CSL and memory cells MC1 to MCn. The source select transistors of cell strings arranged in the same row are coupled to the same source select line. Source select transistors of cell strings CS11' to CS1m' arranged in a first row are coupled to a first source select line SSL1. Source select transistors of cell strings CS21' to CS2m' arranged in a second row are coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string are connected in series between the source select transistor SST and the drain select transistor DST. The gates of the first to n-th memory cells MC1 to MCn are coupled to first to n-th word lines WL1 to WLn, respectively.

The drain select transistor DST of each cell string is connected between the corresponding bit line and the memory cells MC1 to MCn. Drain select transistors of cell strings arranged in a row direction are coupled to drain select lines extending in a row direction. The drain select transistors of the cell strings CS11' to CS1m' in the first row are coupled to a first drain select line DSL1. The drain select transistors of the cell strings CS21' to CS2m' in the second row are coupled to a second drain select line DSL2.

As a result, the memory block BLKb of FIG. 5 has an equivalent circuit similar to that of the memory block BLKa of FIG. 4 except that a pipe transistor PT is excluded from each cell string.

In an embodiment, even bit lines and odd bit lines, instead of first to m-th bit lines BL1 to BLm, may be provided. Further, even-numbered cell strings, among the cell strings CS11' to CS1m' or CS21' to CS2m' arranged in a row direction, may be coupled to the even bit lines, respectively, and odd-numbered cell strings, among the cell strings CS11' to CS1m' or CS21' to CS2m' arranged in the row direction, may be coupled to the odd bit lines, respectively.

Also, in order to reduce an electric field between the source select transistor SST and the memory cells MC1 to MCn, at least one of the first to n-th memory cells MC1 to MCn may be used as a dummy memory cell.

Figure 6:
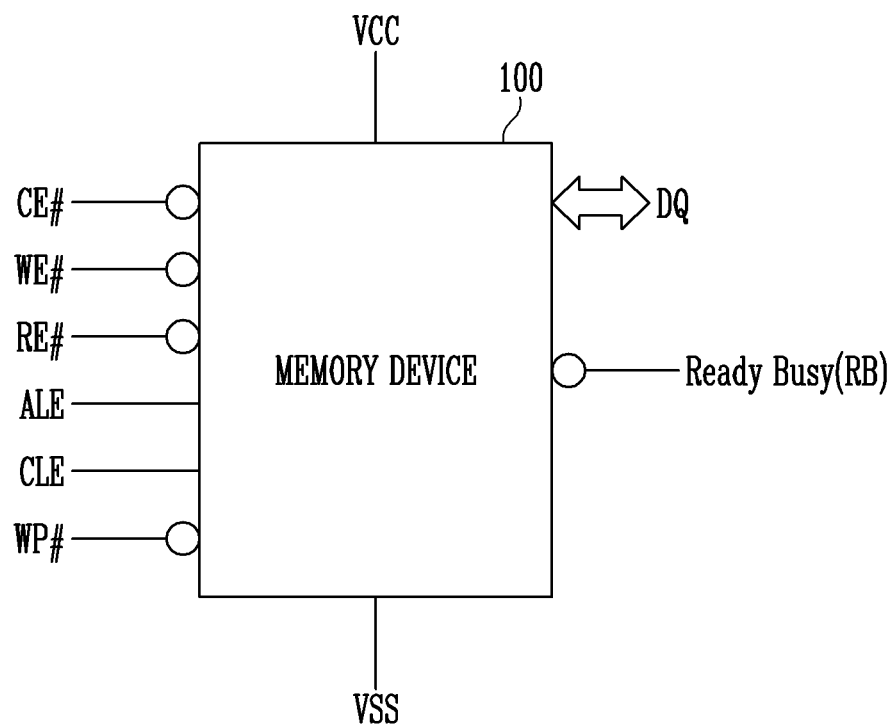
FIG. 6 is a diagram for explaining the pin configuration of a memory device, such as that of FIG. 1.

FIG. 6 is a diagram for explaining the pin configuration of the memory device of FIG. 1.

Referring to FIG. 6, the memory device 100 (shown in FIG. 1) may communicate with an external controller through a plurality of data input/output lines. For example, the memory device 100 may communicate with the external controller through control signal lines which include a chip enable line CE #, a write enable line WE #, a read enable line RE #, an address latch enable line ALE, a command latch enable line CLE, a write protect line WP #, and a ready/busy line R/B, and data input/output lines DQ.

The memory device 100 may receive a chip enable signal from the external controller through the chip enable line CE #. The memory device 100 may receive a write enable signal from the external controller through the write enable line WE #. The memory device 100 may receive a read enable signal from the external controller through the read enable line RE #. The memory device 100 may receive an address latch enable signal from the external controller through the address latch enable line ALE. The memory device 100 may receive a command latch enable signal from the external controller through the command latch enable line CLE. The memory device 100 may receive a write protect signal from the external controller through the write protect line WP #.

In an embodiment, the memory device 100 may provide the memory controller 200 (shown in FIG. 1) with a ready/busy signal, indicating whether the memory device 100 is in a ready state or in a busy state, through the ready/busy line RB.

The chip enable signal may be a control signal for selecting the memory device 100. When the chip enable signal is in a 'high' state and the memory device 100 is in a 'ready' state, the memory device 100 may enter a low-power standby state.

The write enable signal may be a control signal for performing control such that commands, addresses, and input data which are applied to the memory device 100 are stored in a latch.

The read enable signal may be a control signal for enabling the output of serial data.

The address latch enable signal may be one of control signals used by the host to indicate which one of a command, an address, and data corresponds to the type of signal input to the data input/output lines DQ.

The command latch enable signal may be one of control signals used by the host to indicate which one of a command, an address, and data corresponds to the type of signal input to the data input/output lines DQ.

For example, when the command latch enable signal is activated (e.g., to a logic high state), the address latch enable signal is deactivated (e.g., to a logic low state), and the write enable signal is activated (e.g., to a logic low state) and then deactivated (e.g., to a logic high state), the memory device 100 of FIG. 1 may identify that the signal input through the data input/output lines DQ is a command.

For example, when the command latch enable signal is deactivated (e.g., to a logic low state), the address latch enable signal is activated (e.g., to a logic high state), and the write enable signal is activated (e.g., to a logic low state) and then deactivated (e.g., to a logic high state), the memory device 100 may identify that the signal input through the data input/output lines DQ is an address.

The write protect signal may be a control signal for deactivating the program operation and the erase operation that are performed by the memory device 100.

The ready/busy signal may be for identifying the status of the memory device 100. The ready/busy signal in a low state indicates that the memory device 100 is currently performing at least one operation. The ready/busy signal in a high state indicates that the memory device 100 is currently performing no operation.

The ready/busy signal may be in a low state while the memory device 100 is performing a program operation, a read operation, or an erase operation. In an embodiment of the present disclosure, the memory controller 200 described with reference to FIG. 1, may determine a termination time which is the time at which the program operation or the erase operation is terminated based on the ready/busy signal.

Figure 7:
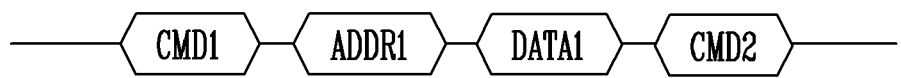
FIG. 7 is a diagram for explaining commands, an address, and data that are input through data input/output lines of FIG. 6.

FIG. 7 is a diagram for explaining commands, an address, and data that are input through data input/output lines DQ of FIG. 6.

FIG. 7 illustrates the flow of commands, an address, and data that are input through the conventional data input/output lines DQ of FIG. 6. That is, FIG. 7 illustrates a first command CMD1, a first address ADDR1, first data DATA1, and a second command CMD2 that are sequentially input through the data input/output lines DQ of FIG. 6.

In an embodiment, the first command CMD1 may be a setup command. The setup command may be a command indicating a scheme of programming the data received from the memory controller 200. That is, in response to the setup command, a scheme corresponding to a single-level cell (SLC) scheme, a multi-level cell (MLC) scheme, a triple-level cell (TLC) scheme, or a quadruple-level cell (QLC) scheme, and/or a program scheme corresponding to any one of a page program scheme, a multi-plane scheme, and a cache program scheme may be determined.

After the first command CMD1, the first address ADDR1 may be received through the data input/output lines DQ. The first address ADDR1 may include a column address and a row address. That is, the first address ADDR1 may indicate a page buffer in which the data received from the memory controller 200 is to be temporarily stored and a memory area in which the data stored in the page buffer is to be stored. The memory area in which data is to be stored may be any one of the memory blocks BLK1 to BLKz included in the memory cell array 110 (shown in FIG. 2).

In an embodiment, the memory device 100 may sequentially receive a column address and a row address included in the first address ADDR1. Based on the received column address, a page buffer included in the page buffer group 123 (shown in FIG. 2) may be determined, and based on the received row address, a memory area or a memory block in which the data stored in the page buffer is to be stored may be determined.

The first data DATA1, received through the data input/output lines DQ after the first address ADDR1, may be data to be stored or programmed in the memory cell array 110. The first data DATA1 may be temporarily stored in any one of page buffers included in the page buffer group 123, and may then be programmed to a memory area determined based on the row address.

In an embodiment, even if the memory area in which the first data DATA1 is to be stored has been determined based on the first address ADDR1, there is a need to change the memory area in which the first data DATA1 is to be stored depending on the amount of data received from an external controller or depending on whether pieces of data are successively received from the external controller. Alternatively, when data other than the first data DATA1 is temporarily stored in the page buffer corresponding to a memory area even if the first data DATA1 should be stored in the memory area, there is a need to change the data stored in the pager buffer.

In this case, before receiving a confirm command, the memory device 100 may receive a command for changing a memory area in which data is to be stored or a command for changing data temporarily stored in the page buffer. Details related to this operation are described below with reference to FIGS. 8A and 8B and subsequent drawings.

A second command CMD2, received through the data input/output lines DQ after the first data DATA1, may be a confirm command. The confirm command may be for instructing the initiation of an operation corresponding to the command determined in response to the setup command. Therefore, when the memory device 100 receives the confirm command, the memory device 100 may program the first data DATA1 received from the memory controller 200 to any one of the plurality of memory areas.

As described with reference to FIG. 7, the memory device 100 may initiate the operation of programming data after receiving the confirm command.

However, as described above, the memory device 100 according to the present disclosure may determine the memory area in which data is to be stored in response to the command received before the confirm command is received, or may determine the memory area in which changed data is to be stored after the data stored in the page buffer group 123 has changed.

Hereinafter, a case where an address or a new command is received between data and the confirm command through the data input/output lines DQ is described.

Figure 8A:
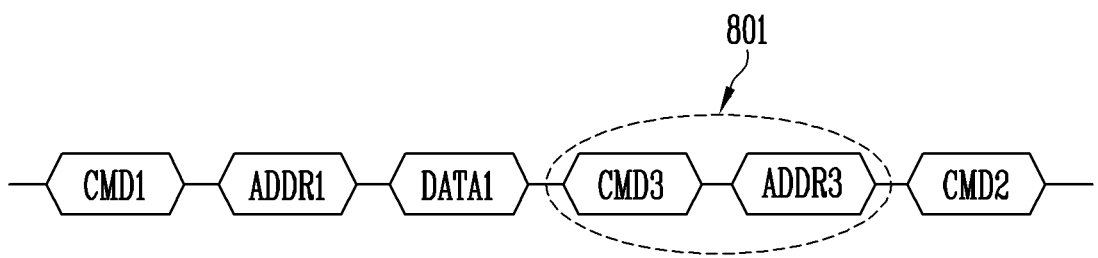
FIGS. 8A and 8B are diagrams for explaining commands and/or addresses that are received through data input/output lines to change a row address.
Figure 8B:
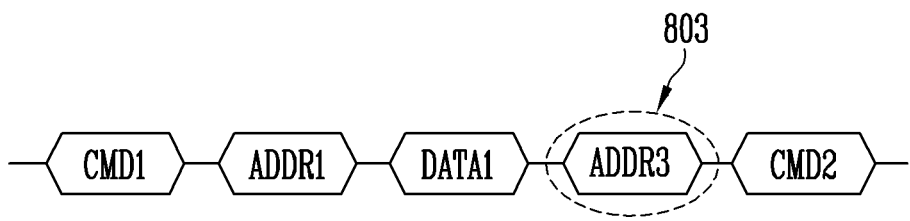

FIGS. 8A and 8B are diagrams for explaining commands and/or addresses that are received through data input/output lines DQ to change a row address.

FIG. 8A illustrates a case where a command and an address are received before a confirm command is received to change a row address, and FIG. 8B illustrates a case where only an address is received before a confirm command is received to change a row address.

In FIGS. 8A and 8B, a first command CMD1, a first address ADDR1, and first data DATA1 may be sequentially received from an external controller through the data input/output lines DQ of FIG. 6.

In an embodiment, the first command CMD1 may be a setup command, and the second command CMD2 may be a confirm command. The setup command may be for determining a scheme of programming the data received from the external controller, and the confirm command may be for instructing the initiation of an operation corresponding to the command determined in response to the setup command. The first address ADDR1 may include a column address and a row address. The first data DATA1 may be data to be programmed to the memory device 100.

In an embodiment, when the first command CMD1, the first address ADDR1, and the first data DATA1 are received from the external controller, the first data DATA1 may be temporarily stored in a page buffer corresponding to the column address included in the first address ADDR1.

Thereafter, when the second command CMD2, that is, the confirm command, is received from the external controller through the data input/output lines DQ of FIG. 6, the memory device 100 may program the first data DATA1 stored in the page buffer to the memory cell array 110. Here, a scheme of programming the first data DATA1 may be determined based on the row address of the first address ADDR1.

However, referring to FIG. 8A, in order to store the first data DATA1 in another memory area other than a memory area corresponding to the row address included in the first address ADDR1, the memory device 100 may receive an address change command and a change address from the external controller before receiving the confirm command.

For example, before receiving the second command CMD2, which is the confirm command, from the external controller, the memory device 100 may receive a third command CMD3 and a third address ADDR3 (801). The third command CMD3 may be an address change command, and the third address ADDR3 may be a change address. The address change command may be for instructing a change of a memory area in which data is to be stored based on the change address. That is, the memory area in which the first data DATA1 is to be stored may change based on the third command CMD3 and the third address ADDR3, and thus a method of storing the first data DATA1 may change.

In FIGS. 8A and 8B, only a row address may be included in the third address ADDR3, or alternatively, both a row address and a column address may be included in the third address ADDR3. Since the third command CMD3 is the address change command for changing a row address, the memory area in which the first data DATA1 is to be stored may be determined based only on the row address, regardless of the column address included in the third address ADDR3.

The operation of the memory device 100 which determines the memory area in which the first data DATA1 is to be stored based on the third command CMD3 and the third address ADDR3, that is, based on the address change command and the change address, is described in detail below with reference to FIG. 9.

Referring to FIG. 8B, before the second command CMD2, that is, the confirm command, is received, the third address ADDR3 for determining again the memory area in which the first data DATA1 is to be stored may be received from the external controller. Unlike in FIG. 8A, in FIG. 8B, the memory device 100 may receive only the third address ADDR3, which is a change address without receiving an address change command, in order to change the memory area in which the first data DATA1 is to be stored (803).

In detail, referring to FIG. 8B, in the same manner as FIG. 8A, the memory device 100 may sequentially receive the first command CMD1, the first address ADDR1, and the first data DATA1 from the external controller through the data input/output lines DQ of FIG. 6.

However, unlike FIG. 8A, in order to change the row address determined based on the first address ADDR1, that is, in order to change the previously determined memory area in which the first data DATA1 is to be stored, the memory device 100 may receive only the third address ADDR3 from the external controller. The memory device 100 may change the memory area, determined by the first address ADDR1, based on the third address ADDR3.

Consequently, referring to FIG. 8B, the memory area in which the first data DATA1 is to be stored may change based only on the third address ADDR3 that is received before the second command CMD2, that is, the confirm command, is received.

Figure 9:
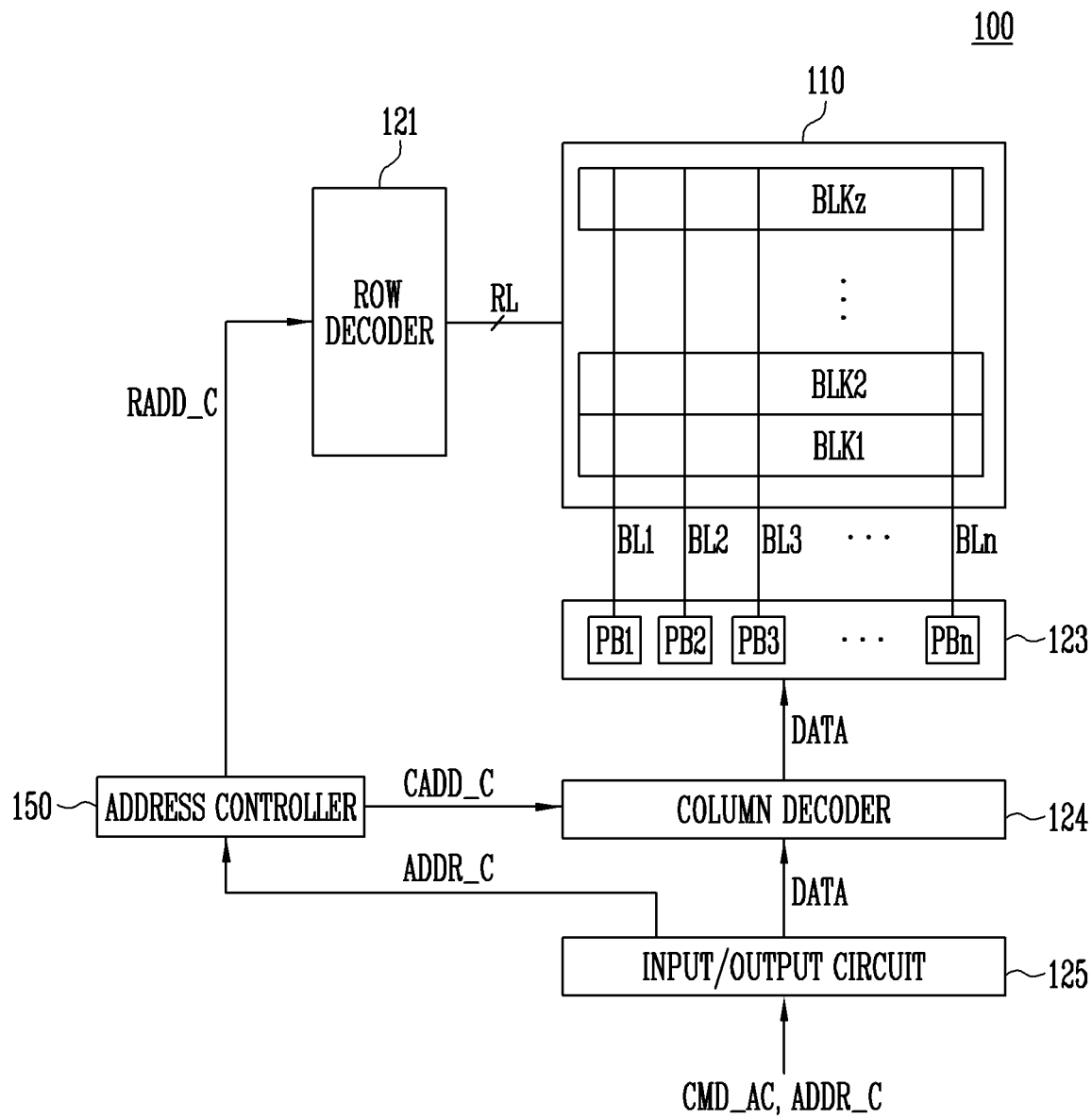
FIG. 9 is a diagram for explaining the operation of a memory device which changes a row address based on the commands and/or addresses received.

FIG. 9 is a diagram for explaining the operation of a memory device which changes a row address based on the commands and/or addresses received in FIGS. 8A and 8B.

Referring to FIGS. 2 and 9, FIG. 9 illustrates a memory cell array 110, a row decoder 121, a page buffer group 123, a column decoder 124, an input/output circuit 125, and an address controller 150, among components of the memory device of FIG. 2. For clarity, the remaining components of the memory device of FIG. 2 are omitted in FIG. 9.

Referring to FIGS. 8A and 8B and 9, an address change command CMD_AC of FIG. 9 may be the third command CMD3 of FIG. 8A, and a change address ADDR_C of FIG. 9 may be the third address ADDR3 of FIGS. 8A and 8B. That is, FIG. 9 illustrates the operation of the memory device performed based on the address change command CMD_AC and the change address ADDR_C that are received before the confirm command is received. In FIG. 9, data DATA is assumed to be the first data DATA1 of FIGS. 8A and 8B.

In an embodiment, after receiving the data DATA, the input/output circuit 125 may receive the address change command CMD_AC and the change address ADDR_C from the external controller through the data input/output lines DQ of FIG. 6. The input/output circuit 125 may transmit the address change command CMD_AC and the change address ADDR_C that are received from the external controller to the control logic 130 of FIG. 2.

In an embodiment, the address controller 150 included in the control logic 130 may control the row decoder 121 and the column decoder 124 so that the data DATA is stored in another memory area other than a selected memory area in response to the address change command CMD_AC. The address change command CMD_AC may be for instructing a change of an address received from the external controller, in detail, the row address included in the first address ADDR1 of FIGS. 8A and 8B.

For example, the address controller 150 may receive the change address ADDR_C from the input/output circuit 125. The address controller 150 may output a change column address CADD_C, among addresses included in the change address ADDR_C, to the column decoder 124, and may output a change row address RADD_C, among the addresses, to the row decoder 121. The address controller 150 may control the row decoder 121 so that another memory area other than a previously selected memory area is selected depending on the change row address RADD_C.

The address controller 150 may output the change row address RADD_C to the row decoder 121, and the row decoder 121 may select a memory area corresponding to the change row address RADD_C from among memory areas included in the memory cell array 110 by decoding the change row address RADD_C.

The row decoder 121 may select the memory area corresponding to the change row address RADD_C, thus enabling a data storage scheme to be changed. For example, although the data storage scheme has been determined to be a single-level cell (SLC), the data may be stored using another scheme, such as a multi-level cell (MLC), a triple-level cell (TLC) or a quadruple-level cell (QLC), by selecting the memory area corresponding to the change row address RADD_C.

In an embodiment, the change address ADDR_C may include the change column address CADD_C. However, since the address change command CMD_AC is for changing a row address and only the change address ADDR_C is externally received, together with the address change command CMD_AC, change data for changing data stored in the page buffer group 123 or storing data in the page buffer group 123 is not received. Therefore, even if the change column address CADD_C included in the change address ADDR_C has been output to the column decoder 124, data may not change.

However, when the memory device 100 receives a subsequent data change command, a subsequent change address, and subsequent data from the external controller after receiving the address change command CMD_AC and the change address ADDR_C, the data previously stored in the page buffer group 123 may be changed into the subsequently-received data based on the change column address included in the subsequent change address.

That is, when the row address changes based on the change address ADDR_C received together with the address change command CMD_AC and thereafter the change column address included in the change address received together with the data change command is transmitted to the column decoder 124, the column decoder 124 may decode the change column address and then change data previously stored in a page buffer corresponding to the change column address, or then store the subsequently-received data in the page buffer corresponding to the change column address.

In addition, when a change row address is included in the change address, received together with the data change command, the row address may change again. That is, even if the row address has changed in response to the address change command CMD_AC, a memory area in which externally received data is to be stored may change based on the row address included in the change address received together with the data change command.

In an embodiment, after the address change command CMD_AC and the change address ADDR_C have been received, a new address change command and a new change address may be received. Although the memory area in which data is to be stored has changed in response to the address change command CMD_AC, when the new address change command is received, the memory area in which the data is to be stored may change again based on a change row address included in the new change address.

As a result, even if the memory device 100 receives the address change command CMD_AC and the change address ADDR_C from the external controller, and then a memory area in which data is to be stored has changed, the memory area in which data is to be stored may change again based on a change row address included in a change address, received together with a new address change command or data change command that is received before a confirm command is received.

Figure 10:
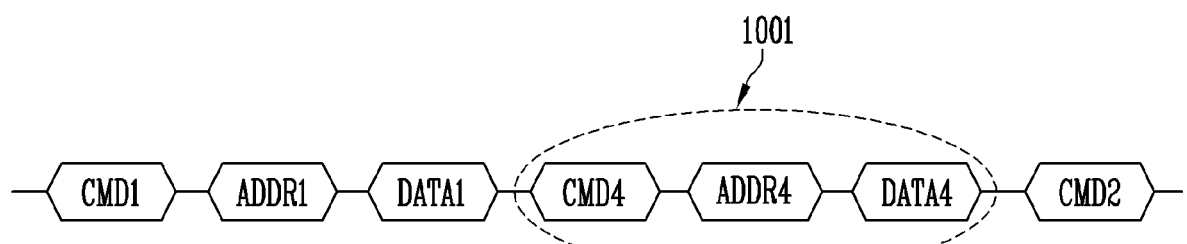
FIG. 10 is a diagram for explaining commands, addresses, and data that are received through data input/output lines to change data.

FIG. 10 is a diagram for explaining commands, addresses, and data that are received through data input/output lines DQ to change data.

FIG. 10 illustrates a case where commands, addresses, and data are received through the data input/output lines DQ of FIG. 6 before a confirm command is received to change data stored in page buffers in the page buffer group 123 of FIG. 2.

Referring to FIGS. 8A, 8B and 10, since the first and second commands CMD1 and CMD2, the first address ADDR1, and the first data DATA1 of FIG. 10 are the same as the first and second commands, the first address, and the first data of FIGS. 8A and 8B, description of those features is omitted here.

In an embodiment, when the first command CMD1, the first address ADDR1, and the first data DATA1 are received from the external controller, the first data DATA1 may be temporarily stored in a page buffer corresponding to the column address included in the first address ADDR1. Thereafter, when the second command CMD2, that is, a confirm command, is received from the external controller, the memory device 100 may store the first data DATA1, stored in the page buffer, in a memory area corresponding to the row address included in the first address ADDR1 in response to a program command determined based on the first command CMD1.

However, before the first data DATA1 is stored in the memory area corresponding to the row address included in the first address ADDR1, there may be a need to change the first data DATA1. That is, when host data received from a host 300 (shown in FIG. 1) is erroneous data, or when there is a need to store new data, the first data DATA1 needs to be changed. In this case, the memory device 100 may receive new data from the external controller, and may then store the new data in the corresponding page buffer.

Referring to FIG. 10, after receiving the first data DATA1 from the external controller through the data input/output lines DQ of FIG. 6, the memory device 100 may receive a fourth command CMD4, a fourth address ADDR4, and fourth data DATA4 (1001). The fourth command CMD4 may be the data change command for changing data stored in the page buffer or storing the data in another page buffer in the page buffer group, the fourth address ADDR4 may be for selecting any one of page buffers in the page buffer group, and the fourth data DATA4 may be data to which previously stored data is to be changed, or data to be newly stored in the page buffer.

Therefore, before the confirm command (that is, the second command CMD2) is received, the data change command CMD4, the change address ADDR4, and the change data DATA4 may be received, and thus the data DATA1 stored in the page buffer in the page buffer group may change into the data DATA4, or alternatively, the data DATA4 may be stored in the page buffer corresponding to the change address ADDR4 and in which no data is stored. Thereafter, when the confirm command CMD2 is received, the data DATA4 stored in the page buffers included in the page buffer group may be programmed to a memory area corresponding to the row address included in the first address ADDR1.

When the row address is included in the fourth address ADDR4 (that is, the change address received together with the fourth command CMD4 that is the data change command), a memory area in which the first data DATA1 is to be stored may be determined, according to the fourth address ADDR4, to be another memory area other than a memory area corresponding to the first address ADDR1. Therefore, in response to the data change command, the memory area in which data is to be stored may also change in addition to the change of data or storage of new data. When the memory area in which data is to be stored changes, a method of storing the first data DATA1 may change.

Figure 11:
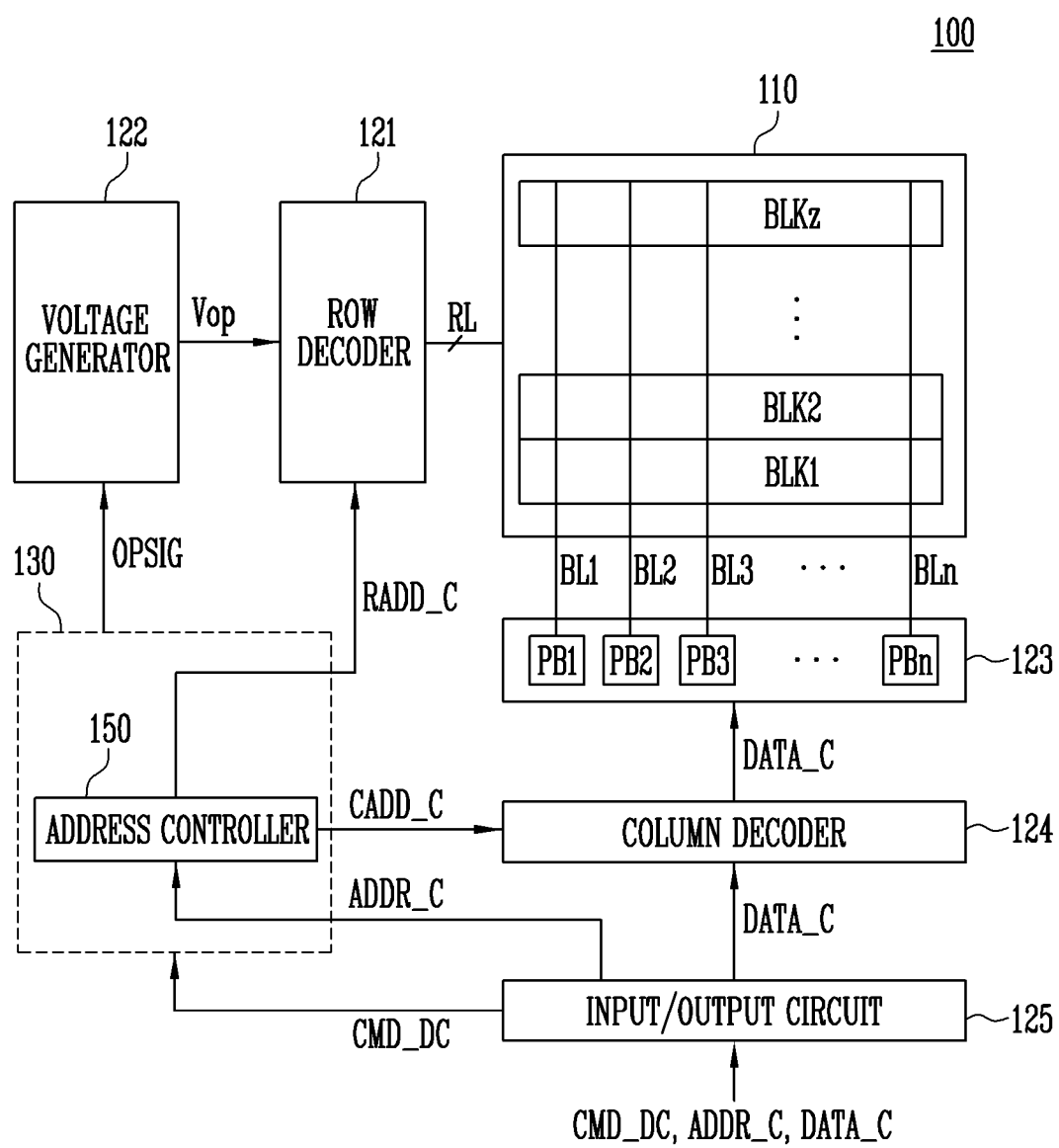
FIG. 11 is a diagram for explaining the operation of a memory device which changes data and/or a row address based on the commands, addresses, and data received.

FIG. 11 is a diagram for explaining the operation of a memory device which changes data and/or a row address based on the commands, addresses, and data received in FIG. 10.

FIG. 11 illustrates a memory cell array 110, a row decoder 121, a voltage generator 122, a page buffer group 123, a column decoder 124, an input/output circuit 125, and a control logic 130, among components of the memory device 100 of FIG. 2. For clarity, the remaining components of the memory device 100 of FIG. 2 are omitted in the memory device 100 of FIG. 11.

Referring to FIGS. 10 and 11, a data change command CMD_DC of FIG. 11 may be the fourth command CMD4 of FIG. 10, a change address ADDR_C of FIG. 11 may be the fourth address ADDR4 of FIG. 10, and change/new data DATA_C of FIG. 11 may be the fourth data DATA4 of FIG. 10. That is, FIG. 11 illustrates the operation of the memory device performed based on the data change command CMD_DC and the change address ADDR_C that are received before the confirm command is received.

In an embodiment, after receiving the first data DATA1 of FIG. 10, the input/output circuit 125 may receive the data change command CMD_DC and the change address ADDR_C from an external controller through the data input/output lines DQ of FIG. 6. The input/output circuit 125 may transmit the data change command CMD_DC and the change address ADDR_C, which are received from the external controller, to the control logic 130, and may transmit the change/new data DATA_C to the column decoder 124.

In an embodiment, the control logic 130 may receive the data change command CMD_DC, and may control the change address ADDR_C so that the change/new data DATA_C is stored in any one of the page buffers PB1 to PBn in the page buffer group 123.

In detail, the address controller 150 in the control logic 130 may receive the change address ADDR_C including a change column address CADD_C and a change row address RADD_C from the input/output circuit 125. In response to the change column address CADD_C, the address controller 150 may control the row decoder 121 and the column decoder 124 so that new data DATA_C is stored in a page buffer, corresponding to the change column address CADD_C, and in which data is temporarily stored, or in a page buffer in which no data is stored. The data change command CMD_DC for storing DATA_C in the page buffer in which data is temporarily stored may be for instructing a change of the first data DATA1 (see FIG. 10).

For example, the address controller 150 may output the change column address CADD_C, among addresses included in the change address ADDR_C, to the column decoder 124, and may output the change row address RADD_C, among the addresses, to the row decoder 121. The address controller 150 may control the column decoder 124 so that a page buffer in which data is to be stored is selected depending on the change column address CADD_C.

The address controller 150 may output the change column address CADD_C to the column decoder 124, and the column decoder 124 may select a page buffer corresponding to the change column address CADD_C by decoding the change column address CADD_C. That is, the column decoder 124 may receive DATA_C from the input/output circuit 125, and may transmit DATA_C to the page buffer corresponding to the change column address CADD_C.

Therefore, the column decoder 124 may change the data previously stored in the page buffers in the page buffer group 123 or store new data in the page buffers in the page buffer group 123 by transmitting DATA_C to the page buffer corresponding to the change column address CADD_C. DATA_C may represent either data resulting from changing the previously-stored data or new data.

In an embodiment, the change address ADDR_C may include the change row address RADD_C. Therefore, although the data change command CMD_DC has been received from the external controller, the memory device 100 may change the memory area in which data is to be stored to another memory area other than the memory area corresponding to the first address ADDR1 (see FIG. 10), based on the change row address RADD_C included in the change address ADDR_C received together with the data change command CMD_DC.

That is, DATA_C stored in the page buffer group 123 may be stored in a new memory area corresponding to the change row address RADD_C included in the change address ADDR_C.

In an embodiment, after receiving the data change command CMD_DC, the change address ADDR_C, and DATA_C, the memory device 100 may subsequently receive another address change command and another change address from the external controller. In this case, based on the subsequent change row address included in the subsequent change address received together with the subsequent address change command, the memory area in which the DATA_C stored in the page buffer group 123 is to be stored may further change.

That is, even if the memory area has been determined according to the first address ADDR1 of FIG. 10 or has changed according to the change row address RADD_C included in the change address ADDR_C (i.e., the fourth address ADDR4 of FIG. 10) received together with the data change command CMD_DC (i.e., the fourth command CMD4 of FIG. 10), the memory area in which data is to be stored may further change based on the subsequent change address that is received together with the subsequent address change command from the external controller.

In an embodiment, after the data change command CMD_DC, the change address ADDR_C, and DATA_C have been received, a subsequent data change command or a subsequent address change command, a subsequent change address, and subsequent change data may be received. In this case, in response to the subsequent data change command, data previously stored in the page buffers included in the page buffer group 123 may change into the subsequent change data, or alternatively, the subsequent change data may be stored in the page buffers corresponding to the subsequent change address. Moreover, based on a subsequent change row address included in the subsequent change address, the memory area in which data is to be stored may further change.

As a result, even if the memory device 100 has received the data change command CMD_DC, the change address ADDR_C, and DATA_C from the external controller, has stored or changed the data, and has then changed a memory area in which data is to be stored, the memory area in which data is to be stored may further change based on a subsequent change row address included in the subsequent change address received together with the subsequent address change command or the subsequent data change command that is received before a confirm command is received.

FIG. 12 is a diagram illustrating a cache program operation.

Referring to FIGS. 11 and 12, each of page buffers PB1 to PBn included in the page buffer group 123 of FIG. 11 may include a cache latch and a main latch. Data received from an external controller may be stored in the cache latch, and data received from the cache latch may be stored in the main latch. The data stored in the main latch may be programmed to a specific area or memory block, among a plurality of memory blocks BLK1 to BLKz, in the memory cell array 110 of FIG. 11. FIG. 12 illustrates any one of the page buffers PB1 to PBn in the page buffer group 123 of FIG. 11.

FIG. 12 illustrates a conventional cache program operation. The cache program operation may include programming data stored in the main latch and storing data received from an external controller in the cache latch, which are simultaneously performed. By shortening the time required for the program operation through the cache program operation, the program operation may be efficiently performed.

In detail, the data received from the external controller may be stored in the cache latch. At time t0, first data DATA1 may be transferred from the external controller (DATA1 Transfer), and may then be stored in the cache latch. Thereafter, at time t1, the first data DATA1, stored in the cache latch, may be copied to the main latch (DATA1 Copy).

When the first data DATA1 is stored in the main latch, the first data DATA1 may be programmed to a memory cell array at time t2. Here, simultaneously with the operation of programming the first data DATA1 (DATA1 Program), second data DATA2 may be transferred from the external controller (DATA2 Transfer). The operation of programming the first data DATA1 and the operation of receiving the second data DATA2 from the external controller and storing the second data DATA2 in the cache latch may be simultaneously performed, and thus the program operation may be efficiently performed.

At time t3, the second data DATA2, stored in the cache latch, may be copied to the main latch (DATA2 Copy). Thereafter, at time t4, the second data DATA2 stored in the main latch may be programmed to the memory cell array (DATA2 Program) at the same time that third data DATA3 may be transferred from the external controller, and may be stored in the cache latch (DATA3 Transfer). At time t5, the third data DATA3, stored in the cache latch, may be copied to the main latch.

In an embodiment, the present disclosure may be applied to the above-described cache program operation. That is, the data stored in the cache latch may be changed, and the data stored in the main latch may be stored in another memory area, that is, a memory area other than a previously determined memory area.

The cache program operation according to an embodiment of the present invention is described in detail below with reference to FIG. 13.

FIG. 13 is a diagram illustrating a cache program operation to which the present disclosure is applied.

Referring to FIG. 13, FIG. 13 illustrates a case where, during performance of a cache program operation, the memory device 100 receives a data change command before receiving a confirm command from the external controller.

In describing FIG. 13, operations which are the same as those described in connection with FIG. 12 are not described again here.

In an embodiment, at time t0, first data DATA1 may be received from the external controller and stored in the cache latch (DATA1 Transfer). At time t1, the first data DATA1 stored in the cache latch may be copied to the main latch (DATA1 Copy). Then, at time t2, the first data DATA1 stored in the main latch may be programmed (DATA1 Program) at the same time that second data DATA2 received from the external controller may be stored in the cache latch (DATA2 Transfer).

However, when the second data DATA2 stored in the cache latch needs to be changed to other data, the memory device 100 may receive a data change command, a change address, and change data from the external controller. In FIG. 13, the change data is third data DATA3.

In detail, the memory device 100 may store the change data DATA3 in a page buffer corresponding to the change column address included in the change address in response to the data change command received from the external controller. That is, at time t3, the second data DATA2 stored in the cache latch may change to third data DATA3 (i.e., Change DATA2 to DATA3). At this time, when the change row address is also included in the change address, a memory area in which the third data DATA3 is to be stored may also change together with the data DATA3.

After the second data DATA2 stored in the cache latch has changed to the third data DATA3 at time t3, the third data DATA3 stored in the cache latch may be copied to the main latch at time t4 (DATA3 Copy). Thereafter, at time t5, the third data DATA3 stored in the main latch is programmed (DATA3 Program) at the same time that fourth data DATA4 received from the external controller may be stored in the cache latch (DATA4 Transfer).

Consequently, when the memory device 100 performs a cache program operation, the data stored in the cache latch may change in response to the data change command received from the external controller before the confirm command is received, and, in addition, the memory area to which the data stored in the cache latch is to be programmed may also change.

Figure 14A:
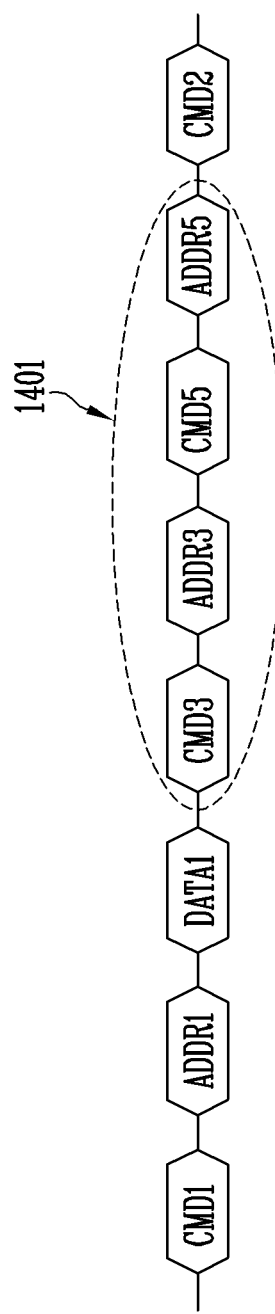
FIGS. 14A and 14B are diagrams for explaining a case where address change commands or data change commands are successively received.
Figure 14B:
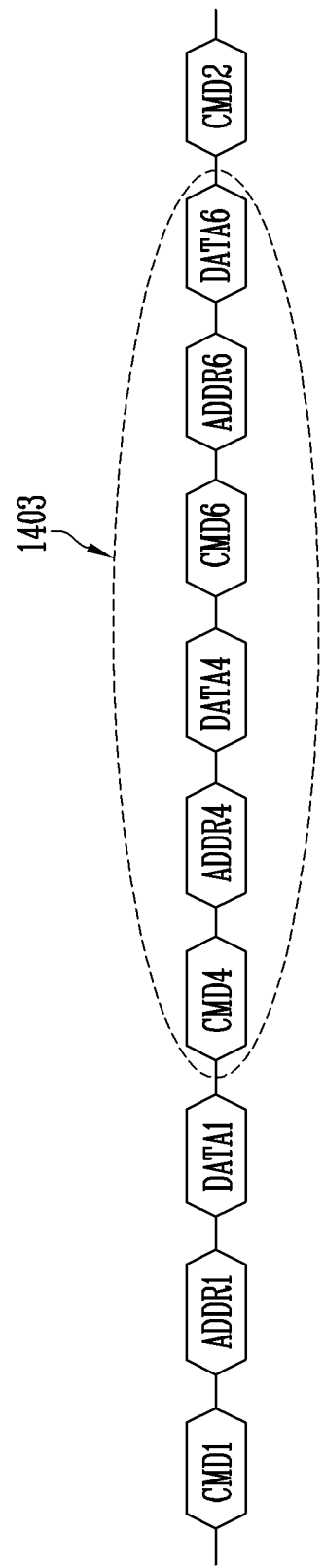

FIGS. 14A and 14B are diagrams for explaining a case where address change commands or data change commands are successively received.

Referring to FIGS. 8A and 8B, FIG. 10, and FIGS. 14A and 14B, FIG. 14A illustrates a case where address change commands, described in FIG. 8A, are successively input, and FIG. 14B illustrates a case where data change commands, described in FIG. 10, are successively input.

In describing FIGS. 14A and 14B, description of operations which are the same as those of FIGS. 8A and 8B and FIG. 10 is omitted here.

In FIG. 14A, a first command CMD1, a first address ADDR1, and first data DATA1 may be sequentially received from an external controller through the data input/output lines DQ of FIG. 6. Thereafter, before a second command CMD2 is received, a third command CMD3, a third address ADDR3, a fifth command CMD5, and a fifth address ADDR5 may be sequentially received (1401). The third command CMD3 and the fifth command CMD5 may be address change commands for instructing a change of a memory area in which data is to be stored, and the third address ADDR3 and the fifth address ADDR5 may be change addresses for changing the memory area.

In an embodiment, in order to change a memory area corresponding to a row address included in the first address ADDR1 to another memory area, the third command CMD3 and the third address ADDR3 may be received from the external controller. That is, in order to change a scheme of programming the first data DATA1, an address change command and a change address may be received.

Even if the memory area in which the first data DATA1 is to be stored has been determined based on the address change command CMD3 and the change address ADDR3, that memory area may change based on a subsequent address change command CMD5 and a subsequent change address ADDR5 that are received after the address change command CMD3 and the change address ADDR3. That is, even if the address change command CMD3 and the change address ADDR3 have been received from the external controller, the memory device 100 may receive a subsequent address change command CMD5 and a subsequent change address ADDR5 from the external controller, and may then change the memory area in which the data DATA1 is to be stored.

Consequently, before the second command CMD2 (confirm command) is received, address change commands CMD3 and CMD5 and change addresses ADDR3 and ADDR5 may be successively received from the external controller, and the memory area in which the first data DATA1 is to be stored may be determined based on the change address ADDR5 received immediately before the second command CMD2 is received. That is, the memory area in which the first data DATA1 is to be stored may be determined based on the change row address included in the fifth address ADDR5 that is received immediately before the second command CMD2 is received.

Referring to FIG. 14B, a first command CMD1, a first address ADDR1, and first data DATA1 may be sequentially received from the external controller through the data input/output lines DQ of FIG. 6. Thereafter, before the second command CMD2 is received, a fourth command CMD4, a fourth address ADDR4, fourth data DATA4, a sixth command CMD6, a sixth address ADDR6, and sixth data DATA6 may be sequentially received (1403). The fourth command CMD4 and the sixth command CMD6 may be data change commands for instructing a change of data stored in the page buffer, the fourth address ADDR4 and the sixth address ADDR6 may be change addresses for changing the data, and the fourth data DATA4 and the sixth data DATA6 may be change data to replace existing data.

In an embodiment, in order to change the data stored in the page buffers PB1 to PBn in the page buffer group 123, the fourth command CMD4, the fourth address ADDR4, and the fourth data DATA4 may be received from the external controller. That is, in order to change the first data DATA1 to the fourth data DATA4 and store the fourth data DATA4, the data change command CMD4, the change address ADDR4, and the change data DATA4 may be received.

Even if the first data DATA1 has changed to the fourth data DATA4 based on the data change command CMD4, the change address ADDR4, and the change data DATA4, the fourth data DATA4 may change to the sixth data DATA6 based on a subsequent data change command CMD6, a subsequent change address ADDR6, and subsequent data DATA6 that are subsequently received. That is, even if the data change command CMD4, the change address ADDR4, and the change data DATA4 have been received from the external controller, the memory device 100 may receive the subsequent data change command CMD6, the subsequent change address ADDR6, and the subsequent data DATA6 from the external controller, and may then change data previously stored in the page buffer corresponding to the subsequent change address ADDR6.

Consequently, before the second command CMD2 that is the confirm command is received, data change commands CMD4 and CMD6, change addresses ADDR4 and ADDR6, and change data DATA4 and DATA6 may be successively received, and data to be stored in the memory area may be determined based on the change data DATA6 that is received immediately before the second command CMD2 is received. That is, the sixth data DATA6, received immediately before the second command CMD2 is received, may be determined to be data that is to be stored in the memory area corresponding to the subsequent change address ADDR6.

FIGS. 15A and 15B are diagrams for explaining a case where an address change command and a data change command are received together.

FIGS. 8A and 8B, FIG. 10, and FIGS. 15A and 15B, FIG. 15A illustrates a case where, after the address change command described in FIG. 8A has been received, the data change command described in FIG. 10 is received, and FIG. 15B illustrates a case where, after the data change command described in FIG. 10 has been received, the address change command described in FIG. 8A is received.

In describing FIGS. 15A and 15B, operations which are the same as those of FIGS. 8A and 8B and FIG. 10 are not described again here.

In FIGS. 15A and 15B, a third command CMD3 may be an address change command for instructing a change of a memory area in which data is to be stored, a third address ADDR3 may be a change address for changing the memory area, a fourth command CMD4 may be a data change command for instructing a change of the data stored in a page buffer, a fourth address ADDR4 may be a change address for changing the data, and fourth data DATA4 may be change data to replace existing data.

In FIG. 15A, a first command CMD1, a first address ADDR1, and first data DATA1 may be sequentially received from the external controller through the data input/output lines DQ of FIG. 6. Thereafter, before the second command CMD2 is received, the third command CMD3, the third address ADDR3, the fourth command CMD4, the fourth address ADDR4, and the fourth data DATA4 may be sequentially received (1501).

In an embodiment, in order to change a memory area corresponding to a row address included in the first address ADDR1 to another memory area, the third command CMD3 and the third address ADDR3 may be received from the external controller. That is, in order to change a scheme of programming the first data DATA1, an address change command CMD3 and a change address ADDR3 may be received.

Based on the address change command CMD3 and the change address ADDR3, the memory area in which the first data DATA1 is to be stored is determined. Then, the data change command CMD4 may be received. That is, even if the address change command CMD3 and the change address ADDR3 have been received from the external controller, the memory device 100 may receive a data change command CMD4, a change address ADDR4, and change data DATA4 from the external controller, and may then change the data previously stored in the page buffer corresponding to the change address ADDR4.

In addition, when a change row address is included in the change address ADDR4, received together with the data change command CMD4, a memory area in which data is to be stored may also change together with the data, that is, change to a memory area corresponding to the change row address and the change data DATA4.

Consequently, before the second command CMD2 that is the confirm command is received, a data change command CMD4, a change address ADDR4, and change data DATA4 may be received after an address change command CMD3 and a change address ADDR3 have been received from the external controller, and not only data stored in the page buffer, but also the memory area in which the data is to be stored may also change. That is, the memory area in which the fourth data DATA4 is to be stored may be determined based on the change row address included in the fourth address ADDR4 that is received before the second command CMD2 is received.

In FIG. 15B, a first command CMD1, a first address ADDR1, and first data DATA1 may be sequentially received from the external controller through the data input/output lines DQ of FIG. 6. Thereafter, before the second command CMD2 is received, the fourth command CMD4, the fourth address ADDR4, the fourth data DATA4, the third command CMD3, and the third address ADDR3 may be sequentially received (1503).

In an embodiment, in order to change the data stored in the page buffers PB1 to PBn included in the page buffer group 123, the fourth command CMD4, the fourth address ADDR4, and the fourth data DATA4 may be received from the external controller. That is, in order to change the first data DATA1 to the fourth data DATA4 and store the fourth data DATA4, the data change command CMD4, the change address ADDR4, and the change data DATA4 may be received.

Even if the first data DATA1 has changed to the fourth data DATA4 based on the data change command CMD4, the change address ADDR4, and the change data DATA4, the memory device 100 may receive an address change command CMD3 and a change address ADDR3 from the external controller. That is, although the memory area in which data DATA4 is to be stored has been determined by the change address ADDR4 received together with the data change command CMD4, or by the address ADDR1 received before the data change command CMD4 is received, the memory area in which data DATA4 is to be stored may change based on the address change command CMD3 received from the external controller.

That is, based on the third command CMD3 that is the address change command, the memory area in which the fourth data DATA4 is to be stored may change depending on the change row address included in the third address ADDR3.

Consequently, before the second command CMD2 that is the confirm command is received, an address change command CMD3 and a change address ADDR3 may be received after a data change command CMD4, a change address ADDR4, and change data DATA4 have been received from the external controller, and not only data stored in the page buffer, but also the memory area in which the data is to be stored may also change. That is, the memory area in which the fourth data DATA4 is to be stored may be determined based on the change row address included in the third address ADDR3 that is received before the second command CMD2 is received.

Figure 16:
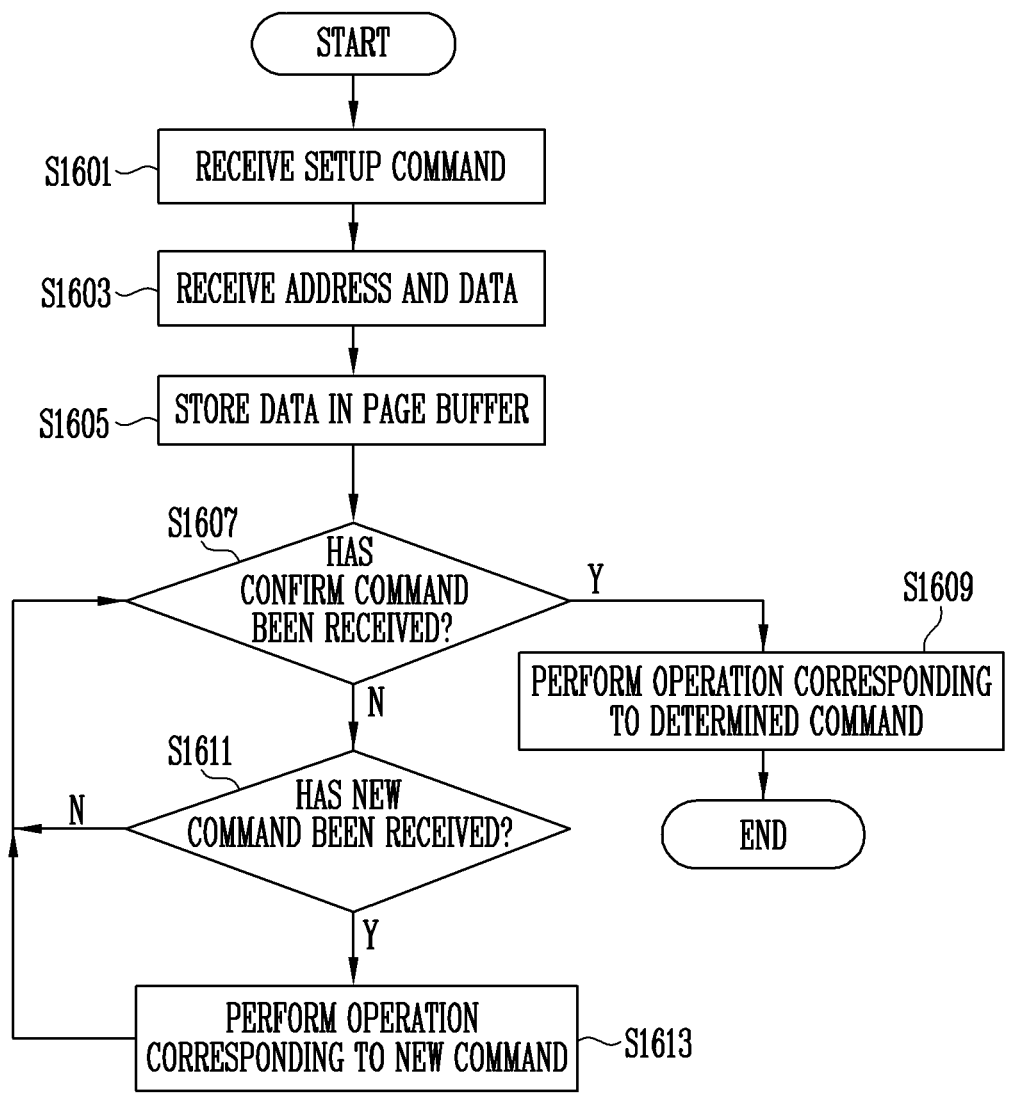
FIG. 16 is a flowchart illustrating operation of a memory device according to an embodiment of the present disclosure.

FIG. 16 is a flowchart illustrating the operation of a memory device according to an embodiment of the present disclosure.

Referring to FIG. 16, at step S1601, the memory device may receive a setup command from the memory controller. The setup command may indicate a scheme of programming data. That is, in response to the setup command, a single-level cell (SLC) scheme, a multi-level cell (MLC) scheme, a triple-level cell (TLC) scheme, or a quadruple-level cell (QLC) scheme may be determined, and/or a page program scheme, a multi-plane scheme, or a cache program scheme may be determined in response to the setup command.

At step S1603, the memory device may receive an address and data from the external controller. The address may include a column address and a row address. Data may be stored in a page buffer corresponding to the column address included in the address at step S1605, and the data stored in the page buffer may be programmed to an area of the memory cell array.

However, a new command may be received before a confirm command for instructing the programming of the data stored in the page buffer to the memory cell array is received. Therefore, after the data has been stored in the page buffer, it may be determined whether the memory device has received a confirm command from the external controller at step S1607.

When it is determined that the memory device has received the confirm command (Y at S1607), the memory device may perform an operation corresponding to a command determined in response to the confirm command at step S1609. That is, using a program scheme determined in response to the setup command, the data stored in the page buffer may be programmed to the memory cell array.

However, when it is determined that the memory device has not received a confirm command (N at S1607), it is determined whether the memory device has received a new command from the external controller at step S1611. When it is determined that the memory device has not received a new command (N at S1611), the process may return to step S1607 where it is determined whether the memory device has received a confirm command. That is, until the confirm command is received, it may be determined whether the memory device has received a new command.

At step S1611, when it is determined that the memory device has received a new command (Y at S1611), the memory device may perform an operation corresponding to the new command at step S1613. The new command may be an address change command for changing a memory area in which data is to be stored or a data change command for changing the data stored in the page buffer. Thereafter, the process returns to step S1607 where it is determined whether the memory device has received a confirm command. That is, until the confirm command is received, the memory area in which data is to be stored may change, and data stored in the page buffer may change.

Figure 17:
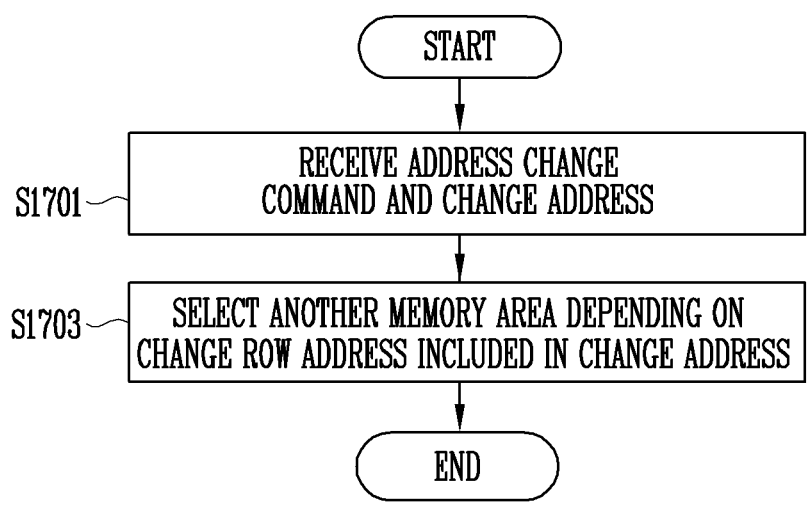
FIG. 17 is a flowchart illustrating operation of a memory device according to an embodiment of the present disclosure.

FIG. 17 is a flowchart illustrating the operation of a memory device according to an embodiment of the present disclosure.

FIG. 17 illustrates sub-steps of step S1613 when a new command is an address change command.

At step S1701, the memory device may receive an address change command and a change address from the external controller. The change address may include a change row address.

That is, before the confirm address is received, the address change command for changing the memory area in which data is to be stored may be received, and another memory area other than a previously selected memory area may be selected based on the change row address included in the change address that is received together with the address change command at step S1703.

When the memory area in which data is to be stored has changed based on the change row address, the memory device may change a scheme of programming data depending on the memory area in which the data is to be stored.

Figure 18:
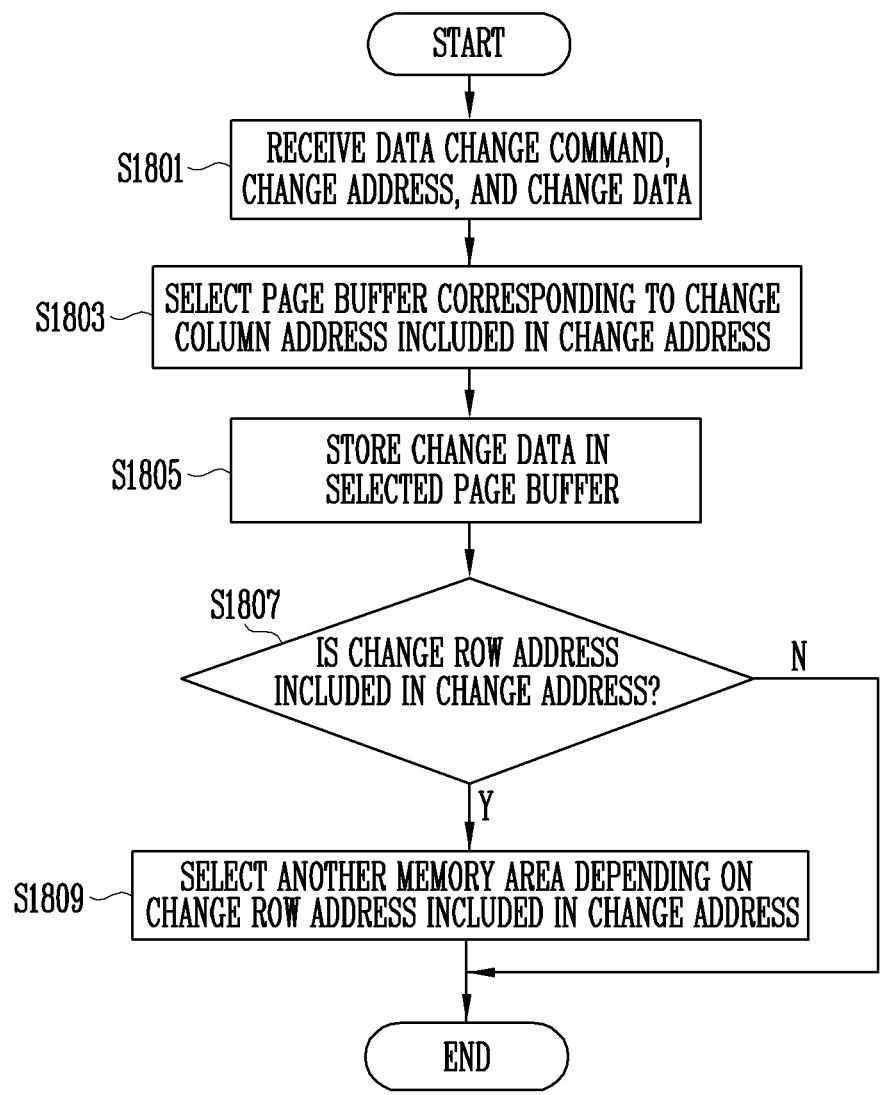
FIG. 18 is a flowchart illustrating operation of a memory device according to an embodiment of the present disclosure.

FIG. 18 is a flowchart illustrating the operation of a memory device according to an embodiment of the present disclosure.

FIG. 18 illustrates sub-steps of step S1613 when a new command is a data change command.

At step S1801, the memory device may receive a data change command, a change address, and change data from the external controller. The data change command may be for instructing a change of data temporarily stored in a page buffer. Therefore, in response to the data change command, the memory device may select a page buffer corresponding to a change column address included in the change address at step S1803. When the page buffer corresponding to the change column address is selected, the memory device may store the change data in the selected page buffer at step S1805.

That is, the page buffer may be selected and the data stored in the selected page buffer may be changed to the change data, or alternatively, new data may be stored in the selected page buffer.

When the change data is stored in the selected page buffer, the memory device may determine whether the change address includes a change row address at step S1807. When it is determined that the change address includes the change row address (Y at S1807), another memory area other than a previously selected memory area may be selected based on the change row address included in the change address at step S1809. That is, in response to the data change command, the data stored in the page buffer may change at the same time that the memory area to which the change data is to be programmed may change.

Figure 19:
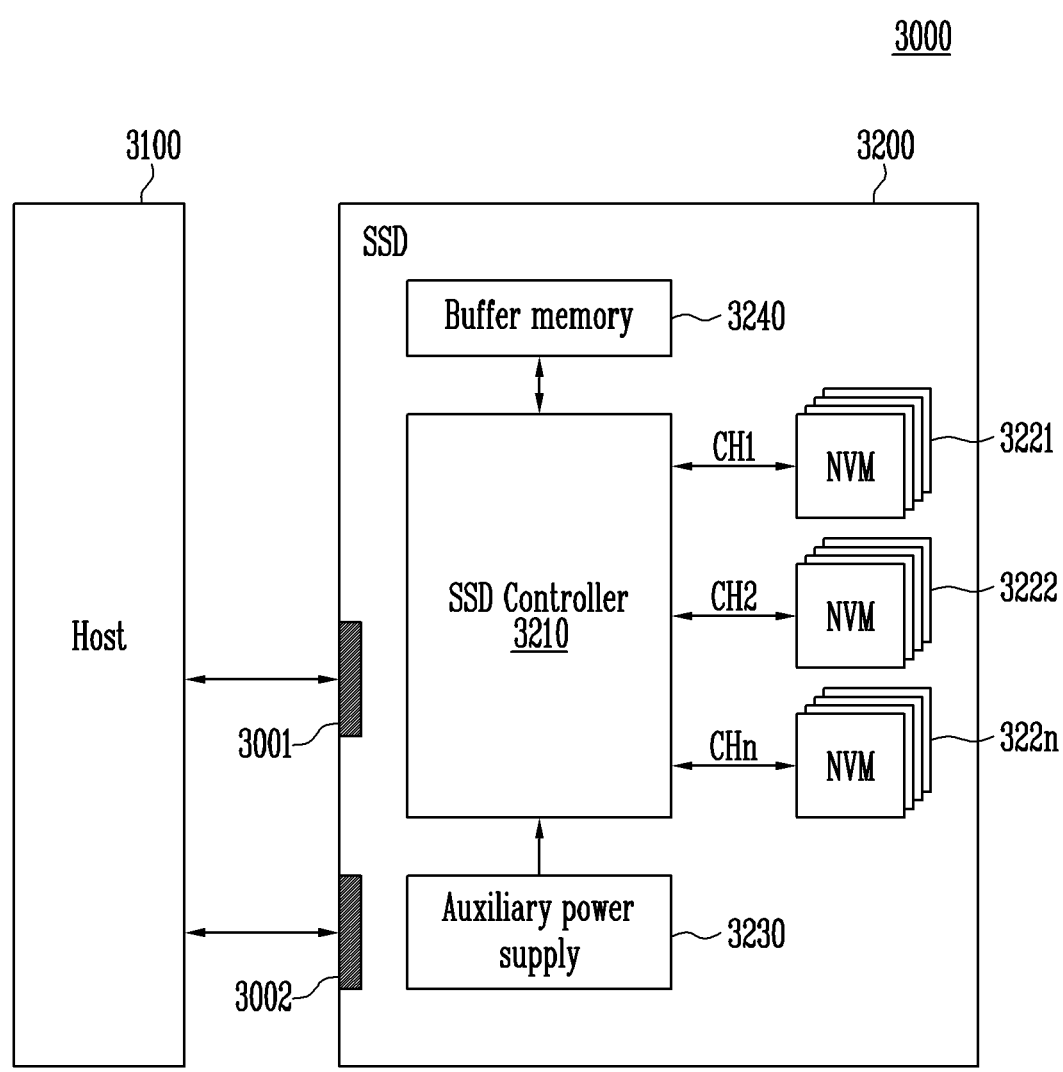
FIG. 19 is a block diagram illustrating an example of a solid state drive (SSD) system to which a storage device is applied according to an embodiment of the present disclosure.

FIG. 19 is a block diagram illustrating an example of a solid state drive (SSD) system to which a storage device may be applied according to an embodiment of the present disclosure.

Referring to FIG. 19, an SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322n, an auxiliary power supply 3230, and a buffer memory 3240.

In an embodiment, the SSD controller 3210 may perform the function of the memory controller 200 described above with reference to FIG. 1.

The SSD controller 3210 may control the plurality of flash memories 3221 to 322n in response to the signals SIG received from the host 3100. In an embodiment, the signals SIG may be signals based on the interfaces of the host 3100 and the SSD 3200. For example, the signals SIG may be defined by at least one of various interfaces such as universal serial bus (USB), multi-media card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and/or nonvolatile memory express (NVMe) interfaces.

The auxiliary power supply 3230 may be coupled to the host 3100 through the power connector 3002. The auxiliary power supply 3230 may be supplied with power PWR from the host 3100 and may be charged. The auxiliary power supply 3230 may supply the power of the SSD 3200 when power from the host 3100 is not smoothly delivered. In an embodiment, the auxiliary power supply 3230 may be positioned inside the SSD 3200 or positioned outside the SSD 3200. For example, the auxiliary power supply 3230 may be disposed in a main board and may supply auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322$n$ or may temporarily store metadata (e.g., mapping tables) of the flash memories 3221 to 322$n$. The buffer memory 3240 may include any of various volatile memories such as DRAM, SDRAM, DDR SDRAM, LPDDR SDRAM, and/or GRAM or any of various nonvolatile memories such as FRAM, ReRAM, STT-MRAM, and/or PRAM.

Each of the plurality of flash memories 3221 to 322$n$ may include an address controller. The address controller may change a memory area in which data is to be stored or the data stored in the page buffer in response to an address change command or a data change command received from the SSD controller 3210.

In an embodiment, the plurality of flash memories 3221 to 322$n$ may receive an address change command or a data change command before receiving a confirm command for instructing the initiation of a program operation from the SSD controller 3210. Here, each of the plurality of flash memories 3221 to 322$n$ may also receive a change address together with the address change command or the data change command.

Each of the flash memories 3221 to 322$n$ selects a memory area corresponding to a change row address included in the change address, thus changing a data program scheme received from the SSD controller 3210.

In accordance with embodiments of the present disclosure, there are provided a memory device and a method of operating the memory device, which reselect a memory area, in which data is to be stored, in response to a newly received command, i.e., a setup command, thus enabling a data program scheme to be changed.

While the present invention has been illustrated and described in connection with various embodiments, those skilled in the art will understand in light of the present disclosure that various modifications may be made. Thus, the present invention is not limited by or to any of the disclosed embodiments. Rather, the present invention encompasses all modifications and variations of any of the disclosed embodiments that fall within the scope of the claims.

What is claimed is:

1. A memory device, comprising:
a memory cell array configured to include a plurality of memory areas;
an input/output circuit configured to receive a command, an address, and data from an external controller;
a page buffer group configured to include a plurality of page buffers respectively coupled to the plurality of memory areas through a plurality of bit lines;
a row decoder configured to select a memory area, on which an operation corresponding to the command is to be performed, from among the plurality of memory areas, based on a row address included in the address;
a column decoder configured to transfer the data to a page buffer of the plurality of page buffers according to a column address included in the address; and
an address controller configured to control the row decoder and the column decoder to store the data in another memory area other than the selected memory area, in response to an address change command received from the external controller before the input/output circuit receives a confirm command instructing an initiation of the operation from the external controller.

2. The memory device according to claim 1, wherein:
the input/output circuit receives the address change command and a change address from the external controller, and
the address controller controls the row decoder to select the another memory area according to a change row address included in the change address.

3. The memory device according to claim 1, wherein:
the input/output circuit receives a data change command for instructing a change of the data, a change address, and change data from the external controller, and
the address controller controls the row decoder and the column decoder to store the change data in an area corresponding to the change address in response to the data change command.

4. The memory device according to claim 3, wherein the address controller controls the column decoder to store the change data in the page buffer in which the data is stored, among the plurality of page buffers, according to a change column address included in the change address.

5. The memory device according to claim 4, wherein the address controller controls the row decoder to store the change data in a memory area corresponding to a change row address included in the change address.

6. The memory device according to claim 3, wherein the address controller controls the column decoder to store the change data in another page buffer other than the page buffer in which the data is stored, among the plurality of page buffers, according to a change column address included in the change address.

7. The memory device according to claim 3, wherein the address controller controls the row decoder to store the change data in a memory area corresponding to a change row address included in the change address.

8. The memory device according to claim 3, wherein the address controller controls the column decoder to store the change data in a cache buffer in which the data is stored according to a change column address included in the change address.

9. A memory device, comprising:
a memory cell array configured to include a plurality of memory areas;
an input/output circuit configured to receive a command, an address, and data from an external controller;
a page buffer group configured to include a plurality of page buffers respectively coupled to the plurality of memory areas through a plurality of bit lines;
a row decoder configured to select a memory area, on which an operation corresponding to the command is to be performed, from among the plurality of memory areas according to a row address included in the address;

a column decoder configured to transfer the data to a page buffer of the plurality of page buffers according to a column address included in the address; and an address controller configured to control the column decoder to store change data for changing the data in the page buffer of the plurality of page buffers in response to a data change command that is received from the external controller before the input/output circuit receives a confirm command instructing an initiation of the operation from the external controller.

10. The memory device according to claim 9, wherein:

the input/output circuit receives the data change command, a change address, and the change data from the external controller, and the address controller controls the column decoder to select a page buffer of the plurality of page buffers according to a change column address included in the change address.

11. The memory device according to claim 10, wherein the address controller controls the row decoder to store the change data in another memory area other than the selected memory area according to a change row address included in the change address.

12. The memory device according to claim 9, wherein:

the input/output circuit receives the data change command, a change address, and the change data from the external controller, and the address controller controls the column decoder to select a cache buffer in which the data is stored according to a change column address included in the change address.

13. The memory device according to claim 9, wherein:

the input/output circuit receives a new data change command, a new change address and a new change data from the external controller, and the address controller controls the row decoder to select another memory area other than the selected memory area according to a change row address included in the change address.

14. A method of operating a memory device, the memory device including a plurality of memory areas and a plurality of page buffers respectively coupled to the plurality of memory areas through a plurality of bit lines, the method comprising:

receiving a command, an address, and data from an external controller;

selecting a memory area, on which an operation corresponding to the command is to be performed, from among the plurality of memory areas according to a row address included in the address;

transferring the data to a page buffer of the plurality of page buffers according to a column address included in the address;

receiving an address change command for instructing a change of the address;

receiving a confirm command instructing an initiation of the operation from the external controller after the address change command is received; and storing the data in another memory area other than the selected memory area in response to the address change command and the confirm command.

15. The method according to claim 14, wherein:

receiving the address change command comprises receiving a change address corresponding to the another memory area together with the address change command, wherein the data is stored in the another memory area according to a change row address included in the change address.

16. The method according to claim 14, further comprising:

receiving a data change command for instructing a change of the data, a change address, and change data from the external controller; and storing the change data in an area corresponding to the change address in response to the data change command.

17. The method according to claim 16, wherein the change data is stored in the page buffer in which the data is stored, among the plurality of page buffers, according to a change column address included in the change address.

18. The method according to claim 17, wherein the change data is stored in a memory area other than the selected memory area, based on a change row address included in the change address.

19. The method according to claim 16, wherein the change data is stored in a main buffer or a cache buffer in which the data is stored according to a change column address included in the change address.

* * * * *